US011481299B2

(12) United States Patent
Kale

(10) Patent No.: US 11,481,299 B2
(45) Date of Patent: Oct. 25, 2022

(54) TRANSMISSION OF DATA FOR A MACHINE LEARNING OPERATION USING DIFFERENT MICROBUMPS

(71) Applicant: Micron Technology, Inc., Boise, ID (US)

(72) Inventor: Poorna Kale, Folsom, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 281 days.

(21) Appl. No.: 16/703,142

(22) Filed: Dec. 4, 2019

(65) Prior Publication Data
US 2021/0173755 A1 Jun. 10, 2021

(51) Int. Cl.
*G06F 12/02* (2006.01)
*G06F 11/30* (2006.01)
*G11C 11/56* (2006.01)
*G06N 20/00* (2019.01)

(52) U.S. Cl.
CPC ...... *G06F 11/3037* (2013.01); *G06F 11/3058* (2013.01); *G06N 20/00* (2019.01); *G11C 11/5628* (2013.01); *G11C 11/5642* (2013.01)

(58) Field of Classification Search
CPC .................................................. G06F 11/3037
See application file for complete search history.

(56) References Cited

U.S. PATENT DOCUMENTS

| 8,255,153 B2* | 8/2012 | Fregene ............... G05D 1/0094 |
| | | 701/408 |
| 2016/0379137 A1 | 12/2016 | Burger et al. |
| 2018/0067697 A1 | 3/2018 | Lee et al. |
| 2019/0042199 A1 | 2/2019 | Sumbul et al. |
| 2019/0140648 A1* | 5/2019 | Clark ................. H03K 19/1776 |
| 2020/0099586 A1* | 3/2020 | Li ....................... H04L 67/1008 |
| 2020/0105722 A1 | 4/2020 | Sethuraman et al. |
| 2020/0311523 A1 | 10/2020 | Hoang et al. |
| 2021/0050300 A1 | 2/2021 | Lin et al. |

OTHER PUBLICATIONS

U.S. Appl. No. 16/703,091, filed Dec. 4, 2019.
U.S. Appl. No. 16/703,122, filed Dec. 4, 2019.
(Continued)

*Primary Examiner* — Min Huang
(74) *Attorney, Agent, or Firm* — Lowenstein Sandler LLP

(57) ABSTRACT

A system includes a memory device with microbumps and a processing device. The processing device is operatively coupled with the memory device to perform operations. The operations include transmitting data for a machine learning operation based on a set of the microbumps of the memory device where the data is being stored at the memory device. In addition, the operations include determining a change in a condition of the machine learning operation. Furthermore, the operations include that, in response to determining the change in the condition of the machine learning operation, determining a new set of the microbumps of the memory device that are to transmit subsequent data for the machine learning operation. Moreover, the operations include transmitting the subsequent data using the new set of microbumps of the memory device.

20 Claims, 12 Drawing Sheets

(56) References Cited

OTHER PUBLICATIONS

USPTO, Office Action for U.S. Appl. No. 16/703,091, dated Aug. 25, 2020.
USPTO, Final Office Action for U.S. Appl. No. 16/703,091, dated Dec. 1, 2020.
USPTO, Advisory Action for U.S. Appl. No. 16/703,091, dated Jan. 25, 2021.
USPTO, Office Action for U.S. Appl. No. 16/703,091, dated Feb. 23, 2021.
USPTO, Notice of Allowance for U.S. Appl. No. 16/703,091, dated May 5, 2021.
USPTO, Corrected Notice of Allowability for U.S. Appl. No. 16/703,091, dated May 14, 2021.

* cited by examiner

TRANSMISSION OF DATA FOR A MACHINE LEARNING OPERATION USING DIFFERENT MICROBUMPS

TECHNICAL FIELD

Embodiments of the disclosure relate generally to memory sub-systems, and more specifically, relate to transmission of data for a machine learning operation using different microbumps.

BACKGROUND

A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
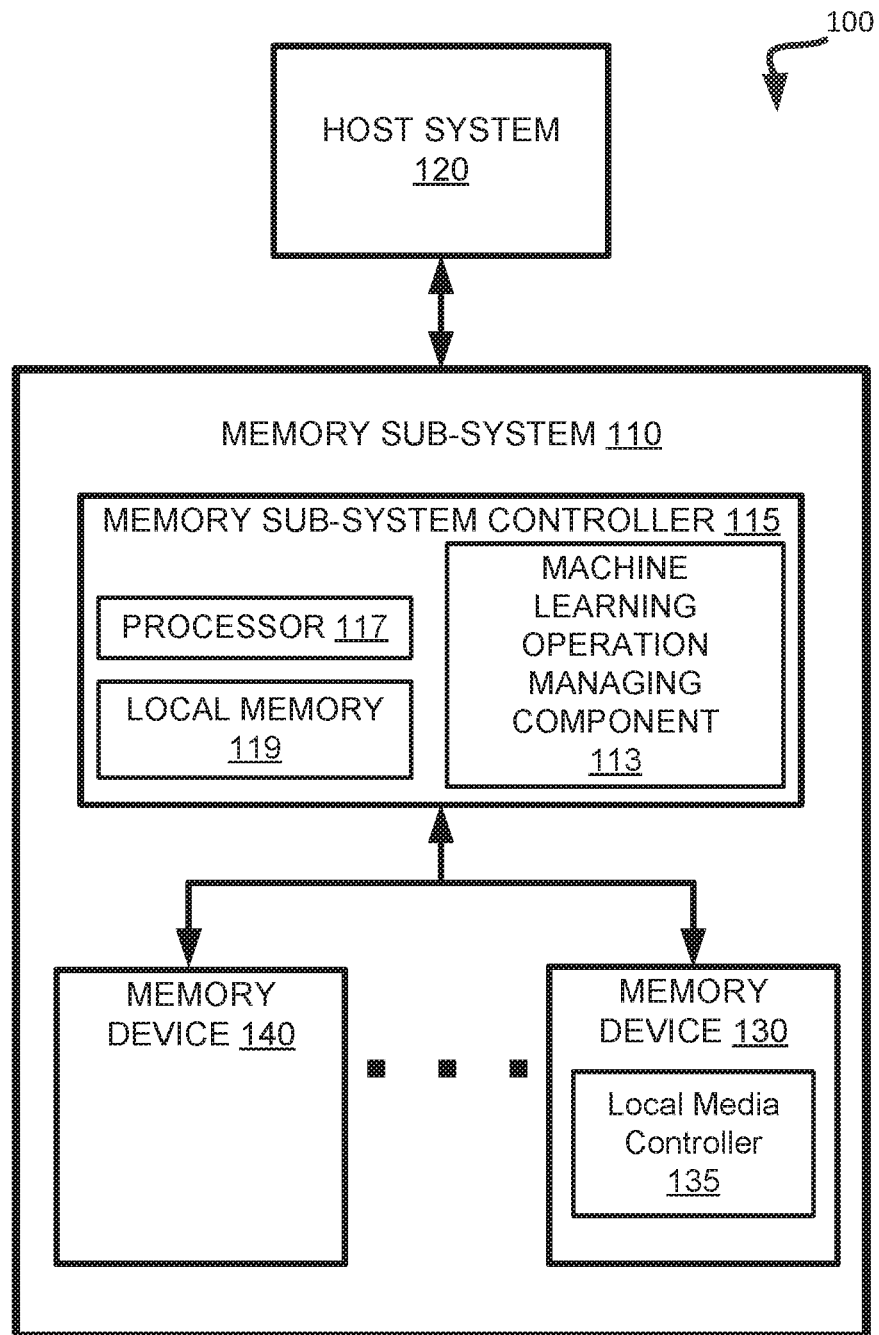
FIG. 1 illustrates an example computing system that includes a memory sub-system in accordance with some embodiments of the present disclosure.

Aspects of the present disclosure are directed to transmission of data for a machine learning operation using different microbumps. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory devices that store data. The host system can provide data to be stored at the memory sub-system and can request data to be retrieved from the memory sub-system.

Moreover, the host system can perform a machine learning operation that utilizes a machine learning model to process data (e.g., image data). For example, the machine learning model can be used to classify the data or make other inferences or decisions based on the processing of the data with the machine learning model. A machine learning model refers to a model artifact that is created by a training process and can be composed of a single level of linear or non-linear operations (e.g., a support vector machine [SVM]) or multiple levels of non-linear operations such as a neural network (e.g., a deep neural network, a spiking neural network, a recurrent neural network, etc.). As an example, a deep neural network model can have multiple layers, and can be trained by adjusting weights of a neural network in accordance with a backpropagation learning algorithm or the like.

The memory sub-system can store the data (e.g., image data to be applied to the machine learning model) that is to be processed by the machine learning operation, as well as any other data associated with the machine learning model. The host system can further utilize a machine learning processor (e.g., a neural network processor or neural network accelerator) that is to perform the machine learning operation based on the data and the machine learning model that are stored at the memory devices of the memory sub-system. For example, the data and the machine learning model can be retrieved from a memory device and provided to the machine learning processor. For certain machine learning operations, there can be a repeated transmission of intermediate data of the machine learning operation (e.g., intermediate data produced by different layers of the machine learning model) between the machine learning processor and the memory device of the memory sub-system.

A conventional memory sub-system can transmit data used in the machine learning operation between the memory devices and the machine learning processor (and/or the host system) using input and output (I/O) pins. The transmitting of data associated with the machine learning operations between the memory devices (and/or memory sub-system) and the machine learning processor (and/or the host system) can require a large amount of data to be transmitted at a high speed. However, a limited number of the I/O pins of the conventional memory sub-system can cannot satisfy the bandwidth and speed required in the transmission of data for the machine learning operation, thereby causing a significant delay in performance of the machine learning operation.

Aspects of the present disclosure address the above and other deficiencies by having a memory sub-system that includes one or more memory devices each having microbumps to transmit data used for performing the machine learning operation. For example, multiple memory devices can store different types of data for the machine learning operation and any one or more of memory devices can have microbumps to interface with the machine learning processor (and/or the host system). Microbumps are interconnect components that are made of tiny metal bumps that can carry power or data signals. Since microbumps are small in size, each of the memory devices can have a larger number of microbumps than I/O pins and thus can transmit much more data for the machine learning operation during a particular period of time.

In addition, aspects of the present disclosure address the above and other deficiencies by having a memory sub-system that selectively uses microbumps of a memory device depending on an operation condition in performing the machine learning operation. For example, when the rapid transmission of data for the machine learning operations is not a top priority, the memory sub-system can change the number of microbumps that are used to transmit data between the memory device and the machine learning processor (and/or the host system) in accordance with a change in the operation condition. The memory sub-system can also select particular microbumps over other microbumps based on their respective location in the memory device in order to improve the signal integrity of data that is being transmitted via the microbumps.

Advantages of the present disclosure include, but are not limited to, the improved performance of a machine learning operation. For example, the rate of data transfer between the memory sub-system and the machine learning processor (and/or the host system) can be significantly increased by using the microbumps. As such, the performance of the memory device or memory sub-system to perform the machine learning operation with the machine learning processor (and/or the host system) can be improved as less time is used to perform a single machine learning operation, thereby facilitating the memory device or memory sub-system to perform additional machine learning operations. Additional advantages can include saving processing resources required in performing the machine learning operations. For example, as the number of microbumps that transmit any data used for the machine learning operations is adjusted, any processing resources consumed to load data to microbumps can be reduced.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) includes a negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point type and NAND type flash memory are described, the memory device 130 can be based on any other type of non-volatile memory, such as read-only memory (ROM), phase change memory (PCM), self-selecting memory, other chalcogenide based memories, ferroelectric random access memory (FeRAM), magneto random access memory (MRAM), negative-or (NOR) flash memory, electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a machine learning operation managing component 113 that can transmit data for a machine learning operation using a set of microbumps of the memory device(s). Depending on a change in a condition of the machine learning operation, the machine learning operation managing component 113 can transmit data for the machine learning operation using a different set of the microbumps of the memory devices(s). In some embodiments, the memory sub-system controller 115 includes at least a portion of machine learning operation managing component 113. For example, the memory sub-system controller 115 can include a processor 117 (processing device) configured to execute instructions stored in local memory 119 for performing the operations described herein. In some embodiments, the machine learning operation managing component 113 is part of the host system 110, an application, or an operating system. Further details with regards to the operations of the machine learning operation managing component 113 are described below.

Figure 2A:
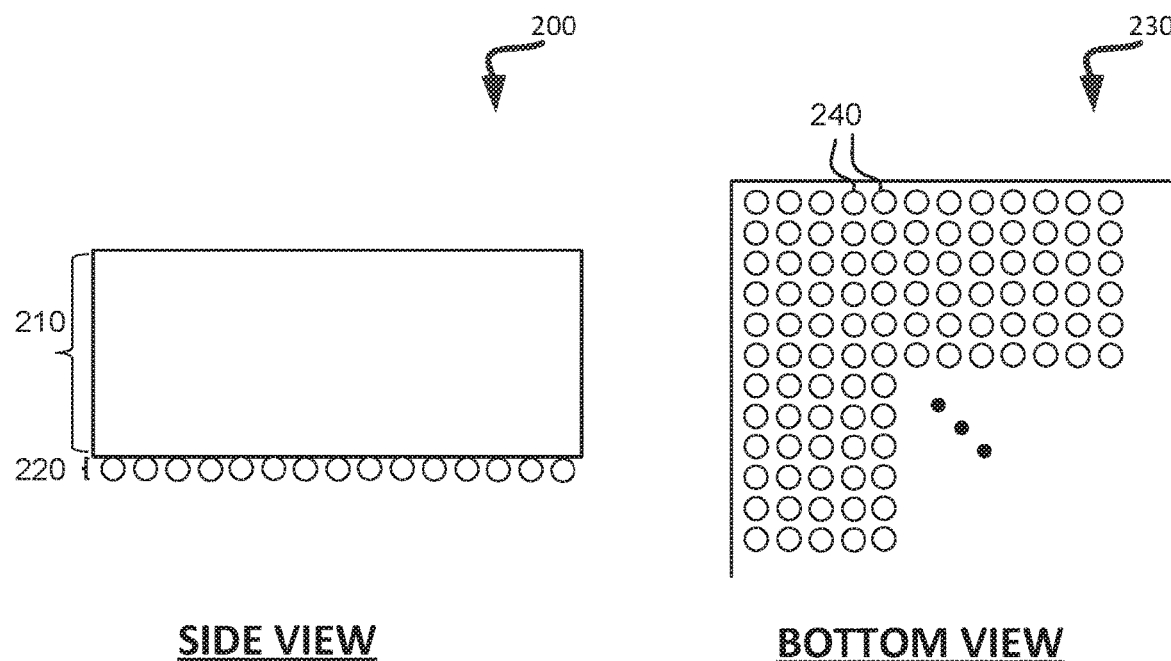
FIG. 2A illustrates a side view and a bottom view of an example memory device that includes microbumps in accordance with some embodiments of the present disclosure.

FIG. 2A illustrates a side view 200 and a bottom view 230 of an example memory device that includes microbumps in accordance with some embodiments of the present disclosure. The memory device of FIG. 2A can correspond to the memory devices 130 or 140 of FIG. 1.

As shown in the side view 200 of FIG. 2A, a memory device can include a logic component 210 and an interface component 220. The logic component 210 can correspond to arrays of memory cells and/or digital logic for a processing device (e.g., a local media controller such as the local media controller 135 of FIG. 1). The logic component 210 can include one or more dies. Further details with regards to a structure of the logic component 210 will be described with respect to FIGS. 7A and 7B below.

The interface component 220 can correspond to arrays of microbumps. The interface component 220 supports power and signals (e.g., data for a machine learning operation) for the respective logic component 210. The interface component 220 can include arrays of microbumps as illustrated in the bottom view 230 of FIG. 2A. The memory device can include thousands (e.g., about five thousand) of microbumps 240. Accordingly, the memory device can transmit a large amount of data through the microbumps 240 at once (e.g., in one clock cycle). As shown in the bottom view 230, each microbump 240 can be disposed adjacent to each other with an equal spacing between each pair of microbumps. Further details with respect microbumps will be described in detail with respect to FIG. 7A below.

In one implementation, the memory device can correspond to a non-volatile memory device to store data for a machine learning operation. Further, such a non-volatile memory device can transmit the data using the microbumps 240 to another device associated with the machine learning operation. That is, in one implementation, the non-volatile memory device can be coupled to another device for the machine learning operation. For example, the microbumps 240 can carry a data signal for the machine learning operation to another set of microbumps included in the other device. Accordingly, each of the microbumps 240 is coupled to each microbump in the other set of microbumps. In one implementation, the non-volatile memory device can be coupled with another memory device, such as a volatile memory including microbumps. In another implementation, the non-volatile memory device can be coupled with a machine learning processing device via the two sets of microbumps.

The machine learning processing device can perform a machine learning operation in association with at least the non-volatile memory device to classify or to support other inferences or decisions based on the processing of data, such as image data. A machine learning operation can involve processing of input data (e.g., image data) in accordance with a machine learning model using a set of weight values for one or more levels of non-linear (or linear) operations. To perform such machine learning operations, the machine learning processing device can request data (e.g., the input data, data for the machine learning model, and data for the set of weight values) from a memory device. Details of the performance of the machine learning operation in association with one or more memory devices and a machine learning processing device will be described with respect to at least FIGS. 4A and 4B.

In another implementation, the memory device can correspond to a volatile memory device to store data for the machine learning operation. Similar to the case of the non-volatile memory device, the volatile memory device can communicate with another device via the arrays of microbumps 240. The volatile memory device can likewise include the logic component 210 and the microbumps 240. The logic component 210 can correspond to arrays of memory cells and the processing device packaged in one or more dies. The microbumps 240 of the volatile memory device can be coupled with another set of arrays of microbumps in the other device. In one implementation, the volatile memory device can be coupled with another memory device, such as a non-volatile memory having microbumps. In another implementations, the volatile memory device can be coupled with the machine learning processing device with the microbumps. Each of the microbumps 240 can be coupled with each microbump of the other device.

Figure 2B:
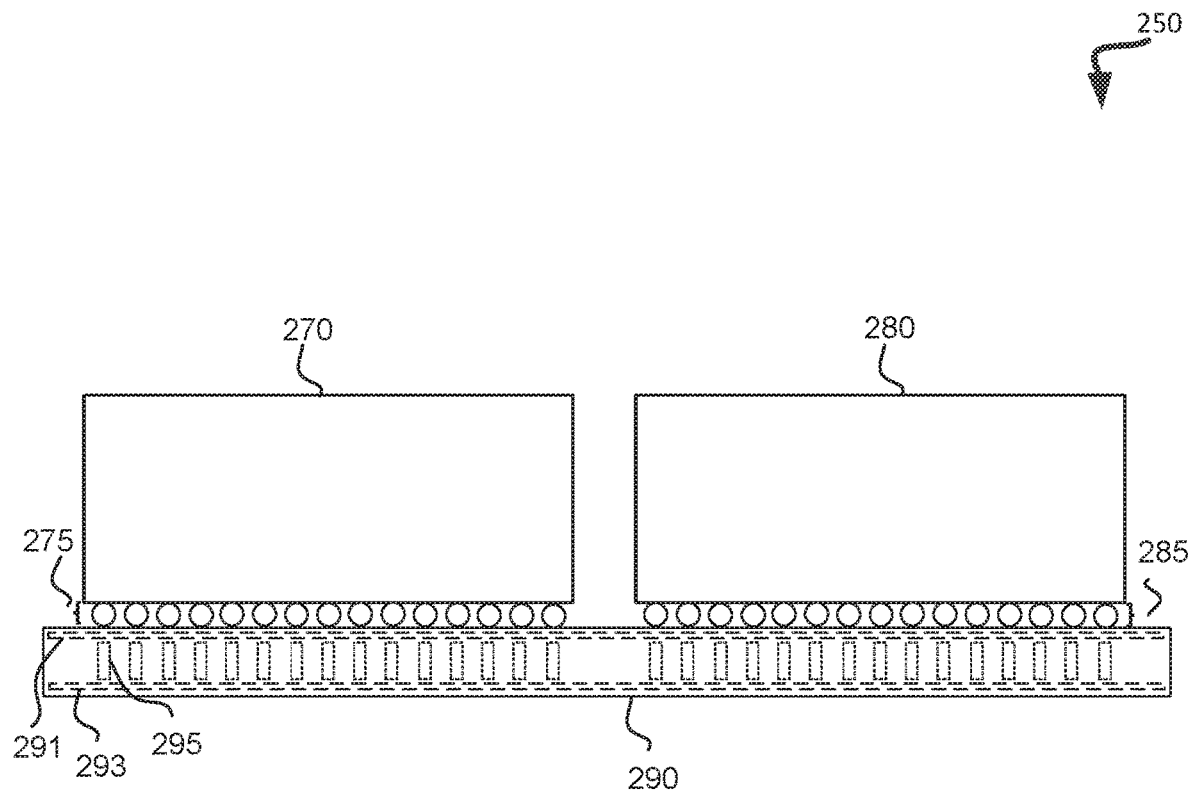
FIG. 2B illustrates an example computing environment that includes a memory device with microbumps and a machine learning processing device with microbumps in accordance with some embodiments of the present disclosure.

FIG. 2B illustrates an example computing environment 250 that includes a memory device 270 with microbumps 275 and a machine learning processing device 280 with microbumps 285 in accordance with some embodiments of the present disclosure. In one implementation, the memory device 270 and the machine learning processing device 280 can be disposed on an interface layer or interposer 290.

The memory device 270 can correspond to the memory device of FIG. 2A. The memory device 270 can thus include microbumps 275. The machine learning processing device 280 can be disposed adjacent to the memory device 270. In one implementation, the machine learning processing device 280 can also include microbumps 285. The machine learning processing device 280 can perform a machine learning operation in association with at least the memory device 270. Details of the performance of the machine learning operation in association with one or more memory devices and a machine learning processing device will be described with respect to at least FIGS. 4A and 4B.

Each of the microbumps 275 of the memory device 270 can be coupled with a corresponding one of the microbumps 285 of the machine learning processing device 280 via the interface layer 290. As such, the number of the microbumps 275 can be the same as the number of the microbumps 285 for transmitting data used in a machine learning operation. The interface layer 290 can be made of silicon or any other conductive materials. To connect a pair of microbumps (e.g., one from the microbumps 275 of the memory device 270 and another from the microbumps 285 of the machine learning processing device 280), the interface layer 290 can include wires or tracks interconnecting the pair of microbumps. Accordingly the interface layer 290 supports a data transfer between the memory device 270 and the machine learning processing device 280.

In further implementations, the interface layer 290 can include a top metal layer 291 and a bottom metal layer 293. In between the two metal layers 291 and 293, the interface layer 290 can include multiple through-silicon-vias (TSVs) vertically interconnecting the two metal layers 291 and 293. In one implementation, there can be one TSV for each microbump 275 or 285. In another implementation, one TSV can interconnect multiple microbumps 275 with the corresponding multiple microbumps 285. Accordingly, the TSVs 295 can support transmitting signal from the 270 and/or 280 to another device that is connected with the bottom metal layer 293.

Figure 3:
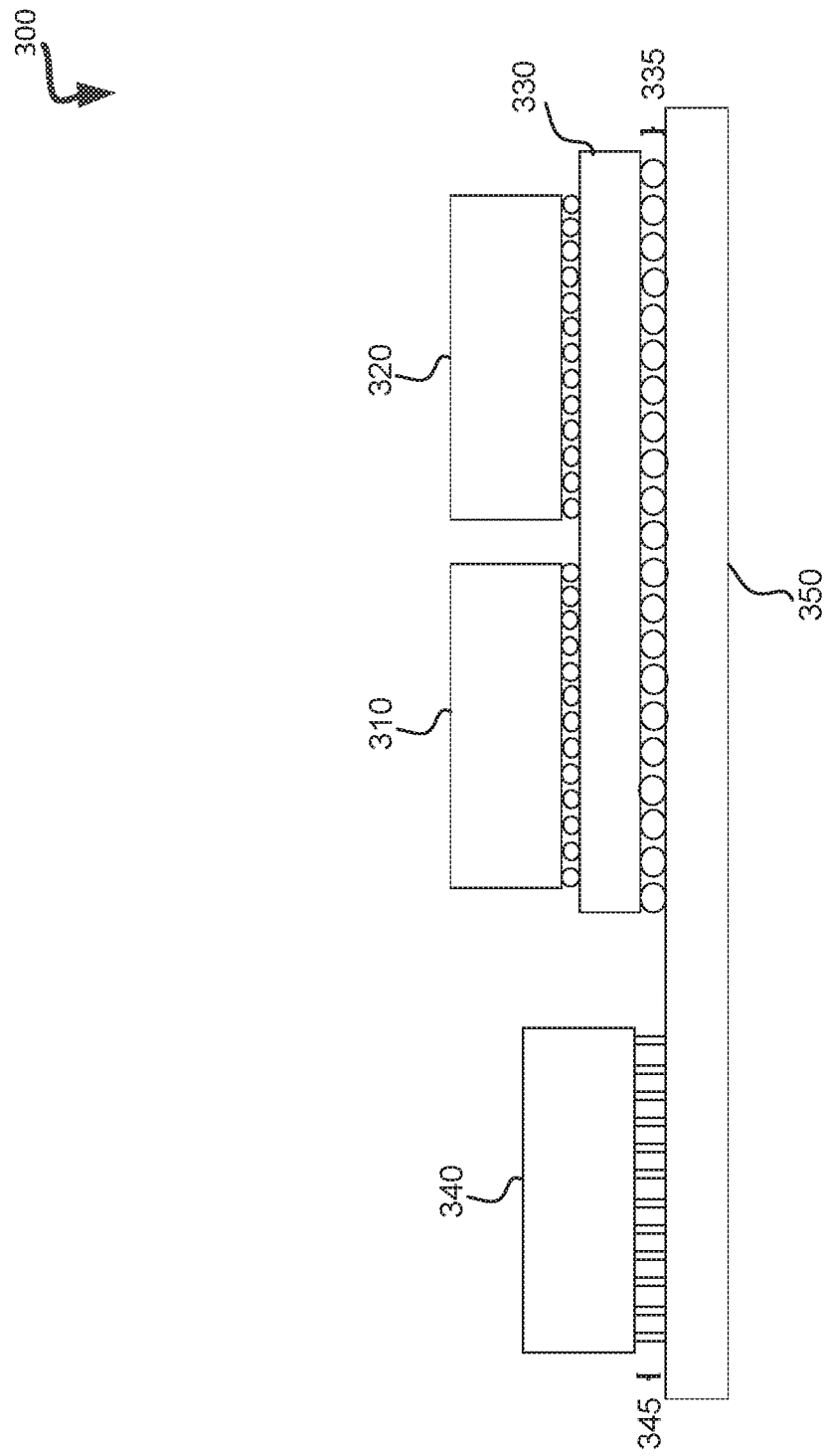
FIG. 3 illustrates an example computing environment that includes a first memory device with microbumps, a machine learning processing device with microbumps, and a second memory device with input and output (I/O) pins in accordance with some embodiments of the present disclosure.

FIG. 3 illustrates an example computing environment 300 that includes a first memory device 310 with microbumps, a machine learning processing device 320 with microbumps, and a second memory device 340 with input and output (I/O) pins 345 in accordance with some embodiments of the present disclosure.

As illustrated in FIG. 3, the memory device 310 and the machine learning processing device 320 are disposed on a first interface layer 330. The first interface layer 330 can correspond to the interface layer 290 of FIG. 2B. Thus, the first interface layer 330 can interconnect the memory device 310 and the machine learning processing device 320. The first interface layer 330 can also include the top and bottom metal layers and through-silicon-vias (not illustrated for simplicity), similar to the interface layer 290 of FIG. 2B. The first interface layer 330 can further couple the memory device 310 and the machine learning processing device 320 with the I/O pins (e.g., I/O pins 345) of another device (e.g., the other memory device 340) via solder balls 335 and a second interface layer or interposer 350.

The solder balls 335 can transmit signal between the first interface layer 330 and the second interface layer 350. A solder ball 335 can be at least ten times bigger (in diameter) than a microbump of the memory device 310 or the machine learning processing device 320. In another implementation, any coupling means other than the solder balls (e.g., pins) can be implemented instead. The second interface layer 350 can transmit a signal between the solder balls 335 to the I/O pins 345 of the other memory device 340. The second interface layer 350 can be made of silicon, copper, or any other conductive material.

In one implementation, the memory device 310 can correspond to a non-volatile memory device and the other memory device 340 can correspond to a volatile memory device. In another implementation, the memory device 310 can correspond to a volatile memory device and the other memory device 340 can correspond to a non-volatile memory device. The other memory device 340 can include the I/O pins 345 for interfacing with other devices via the second interface layer 350. For example, the I/O pins 345 can be eight or sixteen pins for transmitting input and output data signals. Such I/O pins can contribute to a bottleneck (sometimes, called an I/O bottleneck) for a process involving a transfer of a large amount of data within a short amount of time.

Figure 4A:
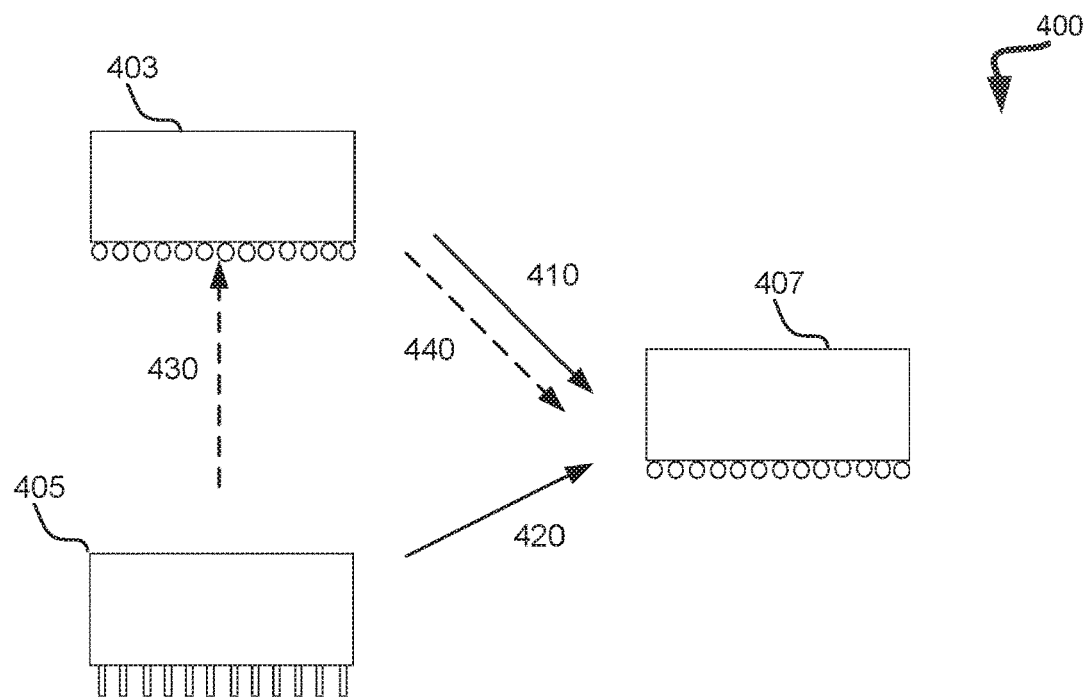
FIG. 4A illustrates an example of performing a machine learning operation in accordance with some embodiments of the present disclosure.

FIG. 4A illustrates an example 400 of performing a machine learning operation in accordance with some embodiments of the present disclosure. A machine learning operation is performed for classification or other inferences or decisions based on the processing of data, such as image data. A machine learning processing device 407 can perform the machine learning operation in association with memory devices 403 and 405.

A machine learning operation involves processing of input data, such as image data in accordance with model data using appropriate weight data. As an example, the machine learning operation can correspond to the use of the model data or the machine learning model to process the input data (e.g., image data) to classify or identify an object or subject of the input data. Accordingly, the input data of the machine learning operation can correspond to data to be processed by the machine learning operation for classification or other inferences or decisions based on the processing of the data. For example, the input data can be image data including pixel bit values associated with an image.

The model data can correspond to a machine learning model or a model artifact that is created by a training process and can be composed of a single level of linear or non-linear operations (e.g., a support vector machine [SVM]) or multiple levels of non-linear operations such as a neural network (e.g., a deep neural network, a recurrent neural network, a convolutional neural network, etc.). The machine learning model be trained by adjusting weights of a neural network in accordance with a backpropagation learning algorithm or the like.

As an example, a deep neural network model can include multiple layers, such as an input layer for receiving input data, an output layer for generating prediction, and a hidden layer(s) between the input and output layers, for performing machine learning operations (e.g., multiply-accumulate operations) on the input data to generate the prediction. Each layer can include or be represented by multiple neurons or nodes. Each node can be assigned a numerical value and coupled to one or more nodes in the next layer through an edge having an assigned weight value. The weight data can correspond to a set of weight values for each layer of the model data or for all the layers. A weight value can be a numerical value, such as any decimal values between an integer of zero and one.

In the example 400 of performing a machine learning operation, the machine learning processing device 407 can communicate with a processing device, such as the machine learning operation managing component 113 to retrieve data needed for performing the machine learning operation from the memory devices 403 and 405. In another implementation, the machine learning processing device 407 can communicate with a respective processing device (e.g., a local media controller 135 of FIG. 1) of each of the memory devices 403 and 405. The machine learning processing device 407 can be a part of or separate from a host system. In one implementation, the memory device 403 can correspond to a non-volatile memory device with microbumps. The microbumps can enable the non-volatile memory device to be interfaced with the processing device, the memory device 405, and/or the machine learning processing device 407. The non-volatile memory device 403 can store the model data and the weight data. On the other hand, the memory device 405 can correspond to a volatile memory device with input and output (I/O) pins to interface with the processing device, the memory device 403, and/or the machine learning processing device 407. The volatile memory device 405 can store the input data. In one implementation, when a picture is taken through a camera of the host system, the processing device can store the image data input data for the machine learning operation in the volatile memory device 405.

Using the deep neural network model example described above, the machine learning processing device 407 can send a request for the model data associated with the deep neural network model. In one implementation, the machine learning processing device 407 can provide the request to the processing device, such as the machine learning operation managing component 113. In another implementation, the machine learning processing device 407 can transmit the request to a processing device of the non-volatile memory device 403 with microbumps, such as the local media controller 135. In the some implementations, the machine learning processing device 407 can provide the request to a processing device of the volatile memory device 405 with the I/O pins, such as the local media controller 135. In response, the processing device can determine whether the model data is stored on the non-volatile memory device 403 with microbumps or the volatile memory device 405 with I/O pins.

At operation 410, once the processing device determines that the model data is stored in the non-volatile memory device 403 with microbumps, the processing device can retrieve the model data from the non-volatile memory device 403. The processing device can determine a microbump(s) of the non-volatile memory device 403 for transmitting the model data to the machine learning processing device 407. Then, the processing device can transmit the retrieved model data to the machine learning processing device 407. In another implementation, the processing device can cause the non-volatile memory device 403 with microbumps to directly transmit the model data to the machine learning processing device 407. Accordingly, the machine learning processing device 407 can directly access the model data from the non-volatile memory device 403 and bypass the processing device (e.g., the machine learning operation managing component 113). In response, the machine learning processing device 407 can implement the deep neural network model from the model data for a machine learning operation.

At operation 420, concurrently or subsequent to the operation 410, the machine learning processing device 407 can transmit another request for input data to be processed by the deep neural network model implemented. In one implementation, the machine learning processing device 407 provide the request to the processing device (e.g., the machine learning operation managing component 113). In another implementation, the machine learning processing device 407 can communicate with the respective processing device of the volatile memory device 405 (e.g., a local media controller 135 of FIG. 1). The processing device can determine that the input data is stored in the volatile memory device 405. The processing device can cause the volatile memory device 405 to directly transmit the input data to the machine learning processing device 407. Accordingly, the machine learning processing device 407 can directly access the input data from the volatile memory device 405 through the I/O pins. In another implementation, the processing device can retrieve the input data from the volatile memory device 405 and provide to the machine learning processing device 407.

In another implementation, depending on the operation condition, such as a processing speed, power supply, or noise level in the memory sub-system, the processing device can manage the two memory devices 403 and 405 to provide any data stored in the memory device 405 with I/O pins (i.e., the volatile memory device 405) to the machine learning processing device 407 either from a memory device 403 with the microbumps (i.e., the non-volatile memory device 403) or the memory device 405 with I/O pins (i.e., the volatile memory device 405). That is, the processing device can determine whether to enable the input data stored in the volatile memory device 405 to be directly transmitted to the machine learning processing device 407 using the I/O pins or indirectly through microbumps of the non-volatile memory device 403.

For example, in case the processing device determines that using the I/O pins of the volatile memory device 405 is slower or less efficient in terms of processing resource consumption (or that using the microbumps of the non-volatile memory device 403 is faster or more efficient), at operation 430, the processing device can retrieve the input data from the volatile memory device 405 with I/O pins and store the input data to the non-volatile memory device 403 with microbumps. Subsequently at operation 440, the processing device can cause the non-volatile memory device 403 with microbumps to provide the input data to the machine learning processing device 407. On the other hand, in a case where the processing device determines that using the I/O pins of the volatile memory device 405 is faster or more efficient in terms of using processing resources (or that using the microbumps of the non-volatile memory device 403 is slower or less efficient), the processing device can perform the operation 420 (i.e., transmitting the data from the volatile memory device 405 with I/O pins to the machine learning processing device 407).

To continue with the example of the deep neural network model, one or more nodes on the current layer can be coupled with one or more nodes in the next layer via a respective edge. Each edge is assigned a weight value which can correspond to a numerical value between zero and one. Accordingly, as the machine learning processing device 407 progresses through each layer of the deep neural network model (e.g., from the input layer to a hidden layer, a hidden layer to another hidden layer, and a hidden layer to output layer), the machine learning processing device 407 can request the weight data or a set of weight values corresponding to the current layer associated with the machine learning operation. A value of a node in the next layer would correspond to an outcome of multiply-accumulate operations. For example, for each node on the current layer coupled to a node in the next layer, a product (i.e., multiplication) of a value assigned to the node on the current layer and a weight assigned to a corresponding edge that couples the node of the current layer to the respective node on the next layer is computed and then added (i.e., accumulated).

Accordingly, the machine learning processing device 407 can send a request for the weight data to the processing device. In one implementation, the machine learning processing device 407 can provide the request only one time, whereas in another implementation, the machine learning processing device 407 can request the weight data each time the machine learning processing device 407 performs the machine learning operation on different layers of the deep neural network model. As described above, once the processing device receives the request from the machine learning processing device 407, the processing device can determine where the weight data is stored. In response to determining that the weight data is stored in the non-volatile memory device 403 with microbumps, the processing device can provide the weight data to the machine learning processing device 407 in a similar manner described above with respect to the operation 410.

In some embodiments, the machine learning processing device 407 can request the processing device to store any intermediary data, such as a numerical value for nodes in intermediate layers generated as a result of the multiply-accumulate operations by the machine learning processing device 407 in a memory device with microbumps (e.g., the non-volatile memory device 403) for faster access by the machine learning processing device 407. In other embodiments, the machine learning processing device 407 can store such intermediary data in an internal memory of the machine learning processing device 407.

After processing the input data (e.g., image data of an animal) based on the model (i.e., performing the multiply-accumulate operations on the input data), the machine learning processing device 407 can generate output data. For example, the output data can include a classification or a category of the input data (e.g., a type of animal species—"cat,") and/or a probability of the input data belonging to the category (e.g., 0.97). In one implementation, the machine learning processing device 407 can request the processing device to store in a memory device with microbumps (e.g., the non-volatile memory device 403) for faster access by the host system. In another implementation, the machine learning processing device 407 can store the output data in the internal memory of the machine learning processing device 407.

Figure 4B:
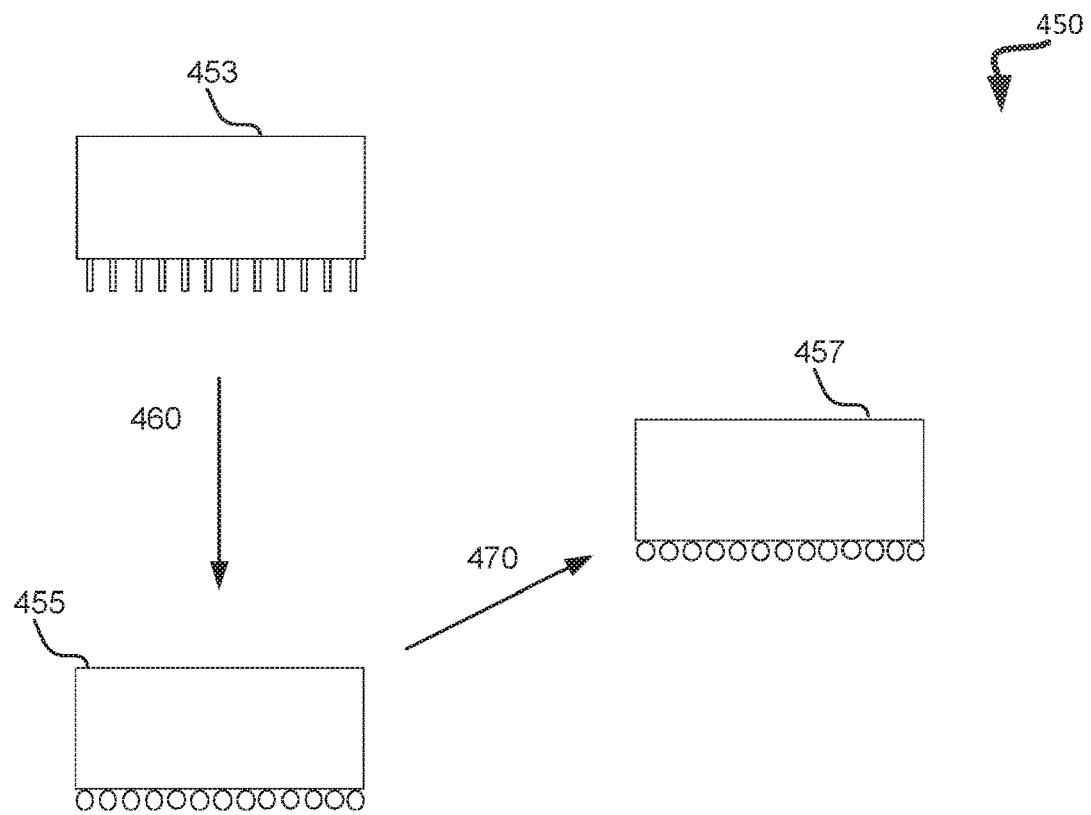
FIG. 4B illustrates another example of performing a machine learning operation in accordance with some embodiments of the present disclosure.

FIG. 4B illustrates another example 450 of performing a machine learning operation in accordance with some embodiments of the present disclosure. Similar to the example 400 illustrated in FIG. 4A, the machine learning operation can be performed in association with memory devices 453 and 455 and a machine learning processing device 457.

In a similar manner described above with respect to FIG. 4A, in the example 450 of performing machine learning operation, the machine learning processing device 457 can communicate with a processing device to retrieve data needed for performing the machine learning operation from the memory devices 453 and 455. The processing device can correspond to the machine learning operation managing component 113 or the local media controller 135 of a respective memory device (i.e., the non-volatile memory device 453 with or the volatile memory device 455).

During the machine learning operation, the machine learning processing device 407 can provide a request to the processing device to access data (e.g., the model data and/or the weight data) stored at the non-volatile memory device 453 with I/O pins. In one implementation, the processing device can determine whether the data is stored in the non-volatile memory device 453 with I/O pins or the volatile memory device 455 with microbumps. Once the processing device determines that the requested data is stored in the non-volatile memory device 453 with I/O pins, at operation 460, the processing device can cause the data to be transmitted to the volatile memory device 455 with microbumps. In one implementation, the processing device can retrieve the data from the non-volatile memory device 453 with I/O pins and transmit the data to the volatile memory device 455 for a write operation.

Consequently, at operation 470, the machine learning processing device 457 can access the requested data from the volatile memory device 455 with microbumps. In this way, the machine learning processing device 457 can access the data needed for the machine learning operation at a much faster rate through the microbumps of the volatile memory device 455, as opposed to using the I/O pins of the non-volatile memory device 453. In one implementation, the processing device can retrieve the requested data from the volatile memory device 455 and transmit the retrieved data to the machine learning processing device 457.

In another implementation, the processing device can cause the volatile memory device 455 with microbumps to directly transmit the data to the machine learning processing device 457. Accordingly, the machine learning processing device 457 can directly access the data from the volatile memory device 455. As such, when a non-volatile memory device 453 has I/O pins as an interface component, the processing device can route any data requested by the machine learning processing device 457 to the volatile memory device with the microbumps for a faster processing of the machine learning operation.

On the other hand, in case where the machine learning processing device 457 requests data stored in the volatile memory device 455 with microbumps, the data can be directly provided to the machine learning processing device 457 in a similar manner as in the operation 410 of FIG. 4A.

Figure 5:
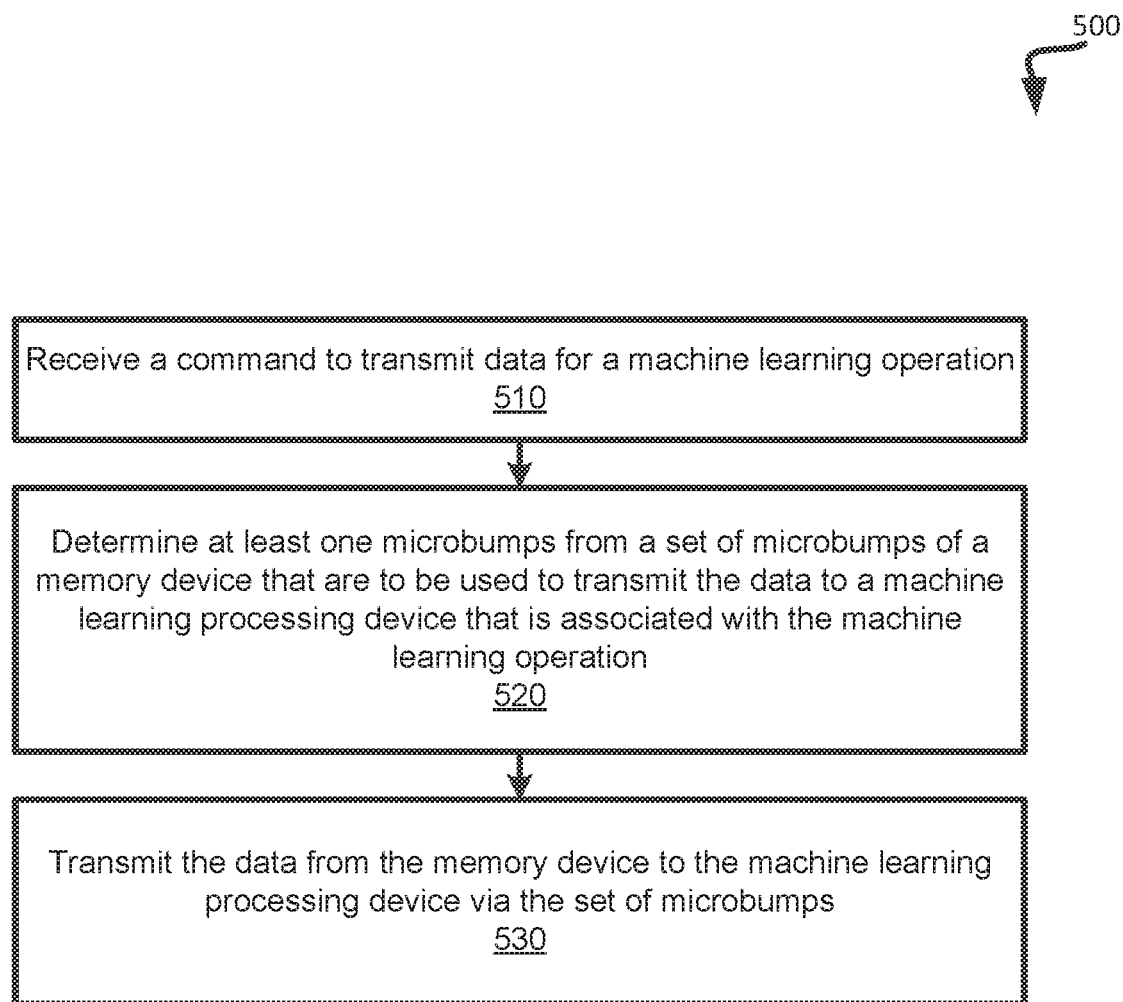
FIG. 5 is a flow diagram of an example method to transmit data for a machine learning operation in accordance with some embodiments of the present disclosure.

FIG. 5 is a flow diagram of an example method 500 to transmit data for a machine learning operation in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the machine learning operation managing component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing device receives a command to transmit data for a machine learning operation. In one implementation, the processing device can receive the command from a host system. The command can include information about the data being requested. For example, the command can include a data address indicating where the data is stored such as which memory device and/or which memory cell(s) of the memory device. The command can also include a type of data, such as input data, model data, or weight data for the machine learning operation as described above.

At operation 520, the processing device determines a set of microbumps of a memory device that are to be used to transmit the data to a machine learning processing device that is associated with a machine learning operation. As an example, the processing device can identify or select one or more microbumps of the memory device to transmit the data requested. Details about selecting which microbumps for the transmission are described with respect to at least FIG. 11. The microbumps are capable of transmitting data stored in the memory device. That is, the microbumps can support data transfer from the memory device to a machine learning processing device. As described above, the machine learning processing device can perform the machine learning operation using the transferred data.

At operation 530, the processing device transmits the data from the memory device to the machine learning processing device via the set of microbumps. In one implementation, the machine learning processing device can include microbumps as well. Accordingly, the processing device can transmit the data from the microbump(s) of the memory device to a microbump(s) of the machine learning processing device. Each microbump of the memory device can be coupled with a respective one microbump of the machine learning processing device. To transmit the data, the processing device can use a pre-generated mapping table that maps a microbump of the memory device to a microbump of the machine learning processing device. Accordingly, before transmitting the data, the processing device can notify the machine learning processing device about which microbump of the memory device will be carrying the data and/or which corresponding microbump of the machine learning processing device will be receiving the data.

In further implementations, the processing device can determine whether the data for the machine learning operation is stored on the memory device (i.e., a memory device with microbumps) or another memory device (i.e., a memory device without microbumps). In one implementation, the processing device can determine from the command received where the data is stored. For example, the processing device can determine a storage location of the data from the data information included in the command. In another implementation, a data address for the data can be stored in a local memory of a memory sub-system controller. In such a case, the processing device can access the data address from the local memory and determine whether the data is stored on the memory device with microbumps or the memory device without microbumps. In response to determining that the data is stored on the memory device with microbumps, the processing device can determine the microbumps for transmitting the data.

On the other hand, in cases where the processing device determines that the data is stored on the memory device without the microbumps, the processing device can retrieve the data from the memory device without the microbumps. Such memory device can have input and output (I/O) pins instead of the microbumps. The I/O pins can be coupled with (microbumps of) the memory device. After retrieving the data from the memory device with the I/O pins, the processing device can store the data to the memory device with microbumps.

For example, the memory device with the microbumps can correspond to a volatile memory device and the memory device without the microbumps can correspond to a non-volatile memory device. The volatile memory device can store the input data and the non-volatile memory device can store the model data and the weight data for the machine learning operation. In case the data requested is data not stored on the volatile memory device, such as the model data and/or the weight data, the processing device can perform read operation on the non-volatile memory device with the I/O pins to access the data. The processing device can subsequently perform a write operation on the volatile memory device with the microbumps to store the read data. In another implementation, the processing device can cause the non-volatile memory device with the I/O pins to transmit the data to the volatile memory device with the microbumps. In one implementation, the processing device can request a local media controller of the non-volatile memory device to read the data from one or more memory cells of the non-volatile memory device and provide the data to the volatile memory device with the microbumps.

In some other implementations, in response to determining that the data is stored on the memory device without microbumps (i.e., instead, with the I/O pins), the processing device can cause the memory device with the I/O pins to transmit the data to the machine learning processing device. In one implementation, the processing device can request a local media controller of the memory device with the I/O pins to transmit the data directly to the machine learning processing device. Such a memory device can have I/O pins that are coupled with the machine learning processing device. Details about how the memory device with the I/O pins can be coupled with the machine learning processing device having the microbumps is described above with respect to FIG. 3.

As another example, the memory device with the microbumps can correspond to a non-volatile memory device and the memory device without the microbumps can correspond to a volatile memory device. Similar to the above example, the volatile memory device without the microbumps can store the input data and the non-volatile memory device with microbumps can store the model data and the weight data for the machine learning operation. In case the data requested is data not stored on the non-volatile memory device with microbumps, such as the input data, the processing device can perform read operation on the volatile memory device without the microbumps (i.e., instead, with the I/O pins) to access the data and perform write operation on the non-volatile memory device with the microbumps to store the data. By transferring the data for the machine learning operation to a memory device having microbumps, the time required to transmit the data can be reduced. Accordingly, the processing device can save processing resources for accessing data used in the machine learning operation. In another implementation, the processing device can cause the volatile memory device with the I/O pins to transmit the data to the non-volatile memory device with the microbumps in a similar manner as described above.

Figure 6A:
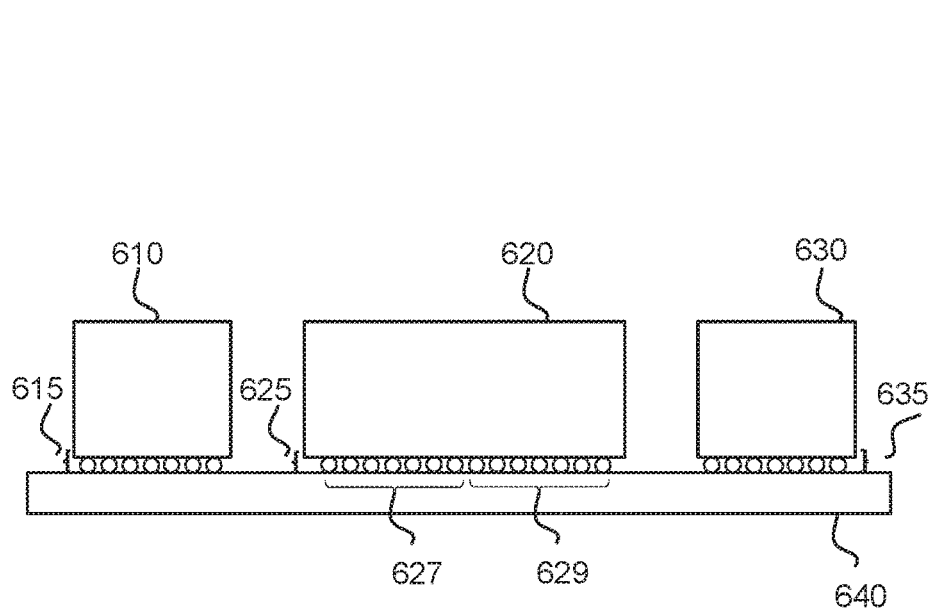
FIG. 6A illustrates an example computing environment that includes memory devices with microbumps and a machine learning processing device with microbumps in accordance with some embodiments of the present disclosure.

FIG. 6A illustrates an example computing environment 600 that includes memory devices 610 and 630 with microbumps 615 and 635, respectively, and a machine learning processing device 620 with microbumps 625 in accordance with some embodiments of the present disclosure.

In one implementation, the memory device 610 can correspond to a non-volatile memory device and the memory device 630 can correspond to a volatile memory device. In another implementation, the memory device 610 can correspond to a volatile memory device and the memory device 630 can correspond to a non-volatile memory device. Each of the memory device 610 and the memory device 630 can store data used in the machine learning operation as the operation is performed by the machine learning processing device 620. Accordingly, the microbumps 615 and the microbumps 635 can transmit the respective data to the machine learning processing device 620 via the microbumps 625 of the machine learning processing device 620.

As illustrated, the two memory devices 610 and 630 and the machine learning processing device 620 can be disposed on an interface layer of interposer 640. The interface layer 640 can correspond to the interface layer 290 of FIG. 2B. Accordingly, the interface layer 640 can interconnect the three devices 610, 620, and 630. The interface layer 640 can also include the top and bottom metal layers and through-silicon-vias for connecting the top and bottom metal layers (not illustrated for simplicity).

In one implementation, the machine learning processing device 620 is disposed between the two memory devices 610 and 630. In this way, the distance between a memory device 610 or 630 and the machine learning processing device 620 can be minimized. However, in other implementations, the two memory devices 610 and 630 can be disposed next to each other. The machine learning processing device 620 can perform a machine learning operation in association with the memory devices 610 and 630. Details about performance of the machine learning operation in association with memory devices and a machine learning processing device will be described with respect to FIG. 6B.

The microbumps 625 of the machine learning processing device 620 can include two sets of microbumps 627 and 629. The first set of microbumps 627 can be coupled with the microbumps 615 of the memory device 610. Each of the first set of microbumps 627 can be coupled with microbump 615 of the memory device 610. In a similar manner, the second set of microbumps 629 can be coupled with the microbumps 635 of the memory device 630. Accordingly, the number of microbumps in the machine learning processing device 620 can correspond to the total number of microbumps in the memory device 610 and the memory device 630. The number of microbumps 615 of the memory device 610 can be greater than the number of microbumps 635 of the memory device 630 and vice versa.

Figure 6B:
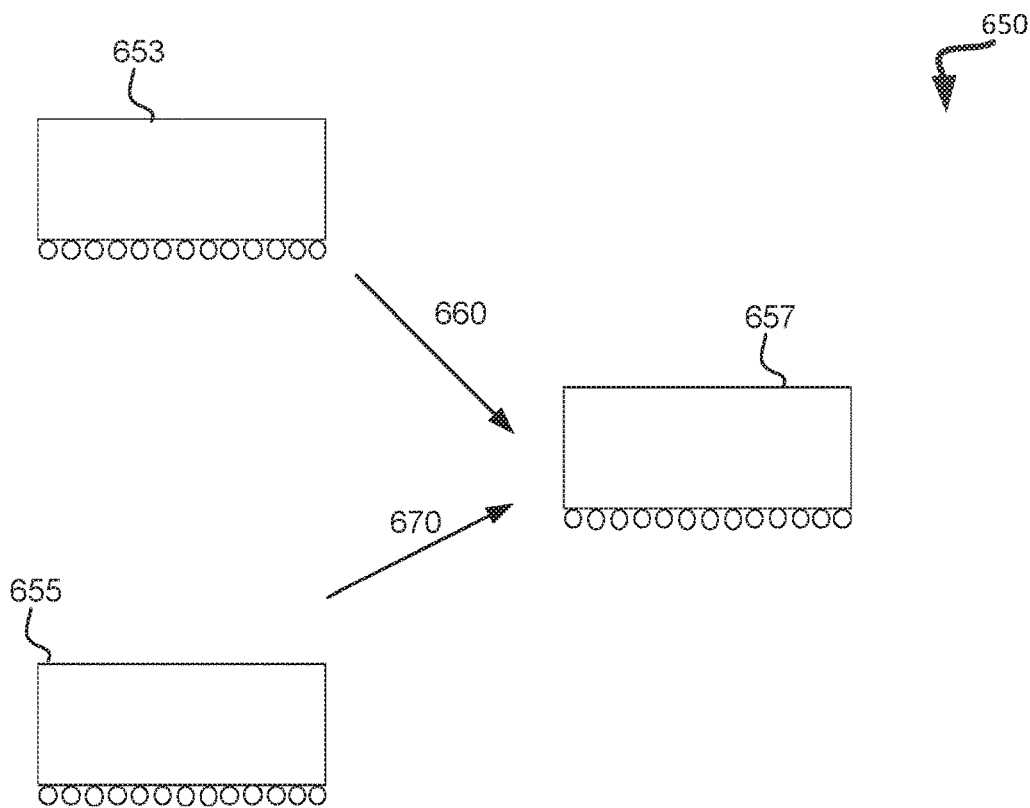
FIG. 6B illustrates an example of performing machine learning operation using memory devices that include microbumps in accordance with some embodiments of the present disclosure.

FIG. 6B illustrates an example 650 of performing a machine learning operation using memory devices 653 and 655 that include microbumps in accordance with some embodiments of the present disclosure. A machine learning operation is performed for classification or other inferences or decisions based on the processing of data, such as image data. A machine learning processing device 657 can perform the machine learning operation in association with memory devices 653 and 655.

The machine learning processing device 657 can be a part of or separate from a host system. In one implementation, the memory device 653 can correspond to a non-volatile memory device with microbumps for an input and output interface component. The memory device 653 can be communicatively coupled with a processing device (e.g., the machine learning operation managing component 113 of the FIG. 1), the memory device 655, and/or the machine learning processing device 657. The non-volatile memory device 653 can store the model data and the weight data. On the other hand, the memory device 655 can correspond to a volatile memory device with microbumps to similarly interface with the processing device, the non-volatile memory device 653, and/or the machine learning processing device 657. The volatile memory device 655 can store the input data. In one implementation, when a picture is taken through a camera of the host system, the processing device can store the image data as input data for the machine learning operation in the volatile memory device 655.

In the example 650 of performing a machine learning operation, the machine learning processing device 657 can transmit a request to the processing device, such as the machine learning operation managing component 113 for access to the model data and the input data. The processing device can determine whether the model data is stored in the non-volatile memory device 653 or the volatile memory device 655. In response to determining that the model data is stored in the non-volatile memory device 653, at operation 660, the processing device enables the machine learning processing device 657 to access the model data stored in the non-volatile memory device 653 via the microbumps of the non-volatile memory device 653 and the microbumps of the machine learning processing device 657.

After accessing the model data, the machine learning processing device 657 can implement, as a part of a machine learning operation, the model data (e.g., a deep neural network model). In addition, the processing device can determine that the input data is stored in the volatile memory device 655. Accordingly, at operation 670, the processing device can enable the machine learning processing device 657 to access the input data stored in the volatile memory device 655 via the microbumps of the volatile memory device 655 and the microbumps of the machine learning processing device 657. In one implementation, the microbumps of the machine learning processing device 657 used to communicate with the volatile memory device 655 can be different from the microbumps of the machine learning processing device 657 used to communicate with the non-volatile memory device 653.

In another implementation, the machine learning processing device 657 can determine where each data needed for the machine learning operation is stored. Then, the machine learning processing device 657 can communicate with the processing device such as the local media controller (e.g., the local media controller 135 of FIG. 1) of each memory devices 653 and 657 to access respective data. For example, in case of the model data, the machine learning processing device 657 can transmit a request for the model data to the processing device of the non-volatile memory device 653 and retrieve the model data directly from the non-volatile memory device 653. In case of the input data, after determining that the input data is stored in the volatile memory device 655, the machine learning processing device 657 can provide a request to the processing device of the volatile memory device 655 and retrieve the input data directly from the volatile memory device 655.

Once the model data and the input data is transmitted to the machine learning processing device 657, the machine learning processing device 657 can process each layer of the deep neural network model in a sequence from an input layer to hidden layer(s) and finally to an output layer. Concurrently or subsequently, the machine learning processing device 657 can request the processing device for weight data. In one implementation, the machine learning processing device 657 can request the weight data once in the beginning of the machine learning operation. In such a case, the weight data can include a set of weight values for each layer of the model. In another implementation, the machine learning processing device 657 can request the respective weight data for each layer. In this case, the weight data can include a set of weight values only for the respective layer.

In a similar manner as at the operation 660, the processing device can enable the machine learning processing device 657 to access the weight data stored in the non-volatile memory device 653 via the microbumps of the non-volatile memory device 653 and the microbumps of the machine learning processing device 657. After processing the input data (e.g., an image of an animal) based on the model data (i.e., performing the multiply-accumulate operations on the input data), the machine learning processing device 657 can generate output data which can include a classification or a category of the input data (e.g., a type of animal species—"cat,") and/or a probability of the input data belonging to the category (e.g., 0.97).

Figure 7A:
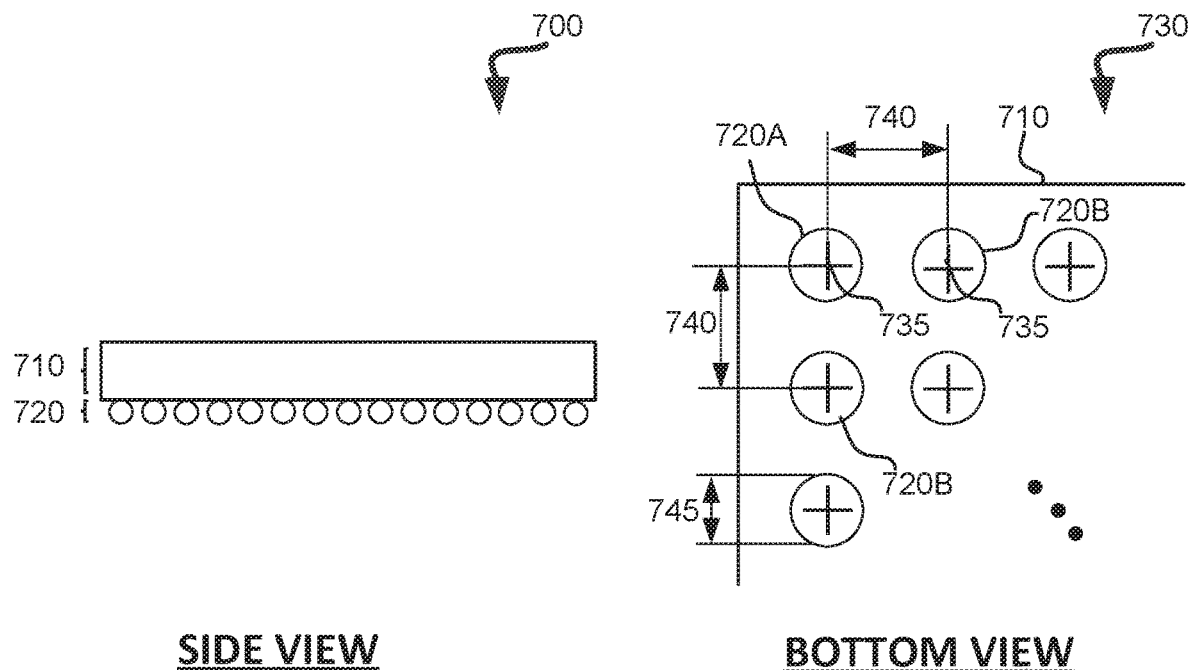
FIG. 7A illustrates a side view and a bottom view of an example memory device comprising a single die and microbumps in accordance with some embodiments of the present disclosure.
Figure 7B:
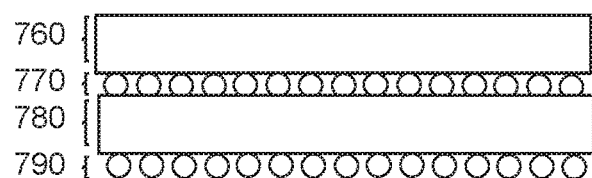
FIG. 7B illustrates an example memory device that includes multiple dies and microbumps in accordance with some embodiments of the present disclosure.

FIG. 7A illustrates a side view 700 and a bottom view 730 of an example memory device that includes a single die 710 and microbumps 720 in accordance with some embodiments of the present disclosure.

As shown in the side view 700, the memory device can include one die 710 and arrays of microbumps 720. The memory device can correspond to a non-volatile memory device or a volatile memory device. The die 710 can include a device layer and a metal layer (not illustrated for simplicity). The device layer can include arrays of memory cells and/or digital logic for a processing device such as the local media controller 135 of FIG. 1. The metal layer of the die 710 can be disposed between the device layer and the microbumps 720 thereby interconnecting the two component.

As illustrated in the bottom view 730, the die 710 can be covered with arrays of microbumps 720A. A microbump can be made of a material or any mixture selected from a group including, but not limited to, copper, gold, nickel, palladium, solder or any other conductive materials. Each microbump 720A can be disposed on the die 710 with an equal distance from another microbump. For example, a microbump 720A can have a pitch of 10 to 30 micrometers ($\mu m$). A pitch refers to a distance 760 between a center 735 of a microbump 720A and a center 735 of an adjacent microbump 720B. Moreover, a microbump 720A can have a diameter 745 ranging from 5 to 15 $\mu m$. In one implementations, all microbumps 720 have the same diameter 745 or substantially the same diameter 745.

In further implementations, a machine learning processing device can similarly have a single die and microbumps disposed on the die. The microbumps can have the similar characteristics as the microbumps 720 as described above FIG. 7B illustrates an example memory device 750 that includes multiple dies 760 and 780 and microbumps 770 and 790 in accordance with some embodiments of the present disclosure. The memory device 750 can correspond to a non-volatile memory device and/or a volatile memory device. In another implementation, a machine learning processing device can be similarly structured as the memory device 750.

The dies 760 and 780 can be structured in a similar manner as the die 210 described above with respect to FIG. 7A. Accordingly, each die 760 and 780 can include a device layer and a metal layer (not shown for simplicity of illustration). However, the die 780 can include two metal layers—one for the top connected with the microbumps 770 and another for the bottom connected with the microbumps 790. Further, the die 780 can include through-silicon-vias (TSVs) connecting the two metal layers. Accordingly, the TSVs can enable the upper die 760 to communicate with the lower die 780. As illustrated, the die 760 can be disposed on the top of the die 780 via the microbumps 770. The microbumps 790 can be disposed on the bottom of the die 780 interconnecting the die 780 with an interface layer, such as the interface layer 290 of FIG. 2B, to be coupled with other devices. In further implementations, the memory device 750 can include more than two dies 760 and 780. In such a case, another set of microbumps can be disposed in between any two adjacent (i.e., any top and bottom dies).

Figure 8:
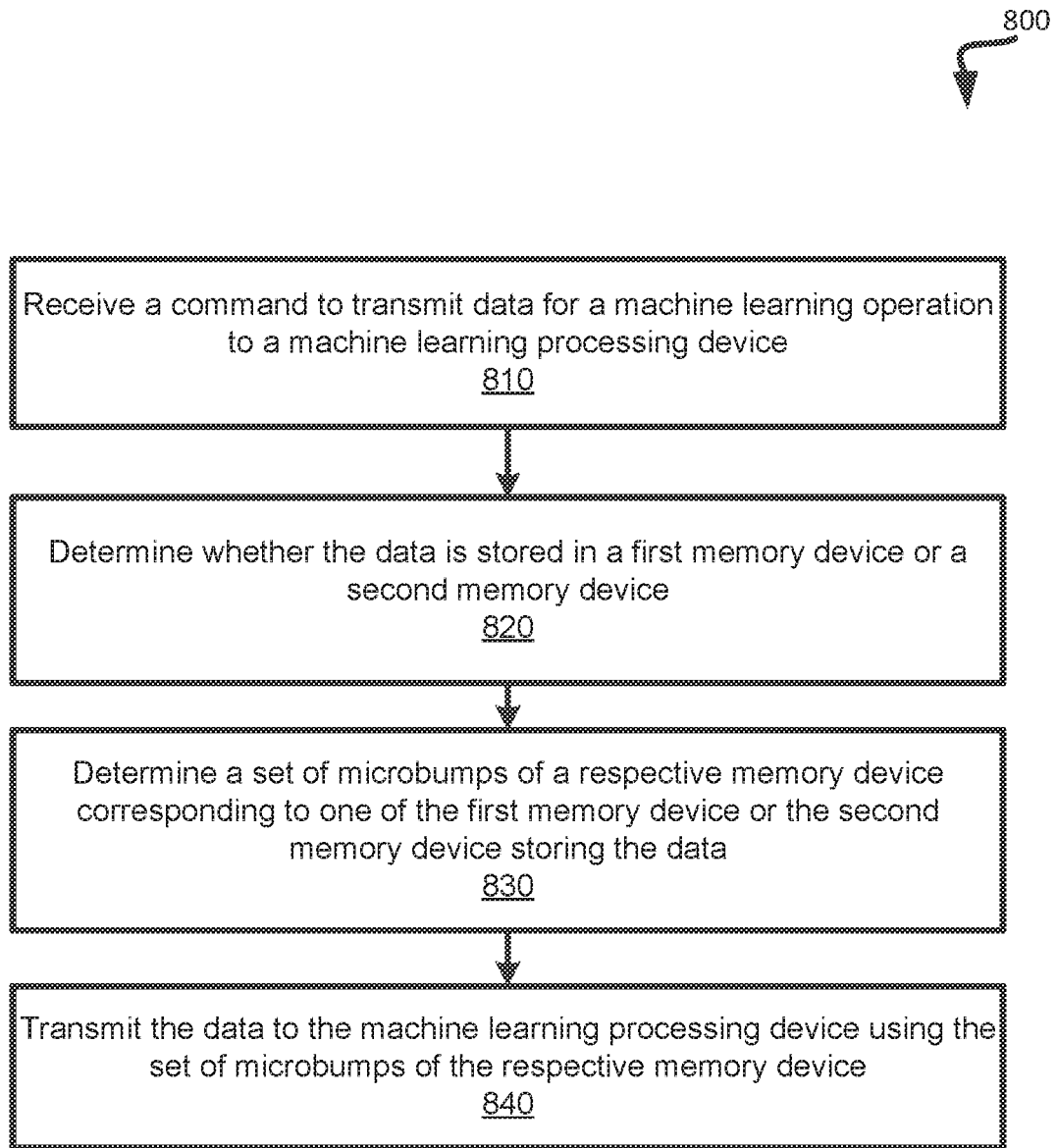
FIG. 8 is a flow diagram of another example method to transmit data for machine learning operation in accordance with some embodiments of the present disclosure.

FIG. 8 is a flow diagram of another example method 800 to transmit data for a machine learning operation in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the machine learning operation managing component 113 of FIG. 1. In some embodiments, the method 800 is performed by the local media controller 135 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, the processing device receives a command to transmit data for machine learning operation to a machine learning processing device. The processing device can receive the command from the machine learning processing device. The machine learning processing device can perform a machine learning operation in association with memory devices. The machine learning processing device can perform the machine learning operation to classify or to support other inferences or decisions based on the processing of data, such as image data. Details about performance of the machine learning operation in association with memory devices was described in details with respect to FIG. 6B. In one implementation, the machine learning processing device performs the machine learning operation using the data stored in memory devices.

At operation 820, the processing device determines whether the data is stored in a memory device (hereinafter, a first memory device) or another memory device (hereinafter, a second memory device). For example, the first memory device can correspond to a non-volatile memory device and the second memory device can correspond to a volatile memory device. Additionally, the first memory device can store model data and weight data and the second memory device can store input data for the machine learning operation.

As described at least with respect to FIG. 4A, the input data of the machine learning operation can correspond to data (e.g., image data including pixel bit values) to be processed by the machine learning operation for classification or other inferences or decisions based on the processing of the data. The model data can correspond to a machine learning model or a model artifact that is created by a training process and can be composed of a single level of linear or non-linear operations (e.g., a support vector machine [SVM]) or multiple levels of non-linear operations such as a neural network (e.g., a deep neural network, a recurrent neural network, a convolutional neural network, etc.). The machine learning model be trained by adjusting weights of a neural network in accordance with a back-propagation learning algorithm or the like. The weight data can correspond to a set of weight values for each layer of the model data. A weight value can be a numerical value such as any decimal values between an integer of zero and one.

Moreover, the first memory device can include arrays of microbumps. The second memory device can also have arrays of microbumps. In one implementation, the number of microbumps of the first memory device can be the same as the number of microbumps in the second memory device. Yet, in other implementations, the number of microbumps of the first memory device can be greater than the number of microbumps in the second memory device and vice versa.

In addition, the machine learning processing device can also include arrays of microbumps. In such a case, the machine learning processing device can be connected with the two memory devices as illustrated in the FIG. 6A. Accordingly, the arrays of the microbumps in the first memory device can be coupled with a portion of the microbumps in the machine learning processing device, whereas the arrays of the microbumps in the second memory device can be coupled to the portion of the microbumps in the machine learning processing device. The microbumps can be coupled with each other in one to one relationship.

At operation 830, the processing device determine a set of microbumps of a respective memory device corresponding to one of the first memory device or the second memory device storing the data. For example, in response to determining that the data is stored in the first memory device, the processing device can select or identify a set of microbumps in the first memory device. Details about selecting which microbumps for transmitting the data will be described with respect to at least FIG. 11. Similarly, the processing device can determine a set of microbumps in the second memory device in response to determining that the data is stored in the second memory device.

In one implementation, in response to determining that the data is stored in the first memory device, the processing device can further determine a type of the data (e.g., input data, model data (which defines a machine learning operation), or weight data (which represents one or more numerical values used in the machine learning operation)) requested for the machine learning operation. The processing device can identify the type of the requested data from the command received at operation 820 or any metadata associated with the command. Subsequently, the processing device can determine the number of microbumps for transmitting the data based on the type of the data. For example, in case that the type of the data corresponds to the model data, the processing device can determine that the number of microbumps for the transmission should correspond to the total number of microbumps in the first memory device. In this way, the processing device enable a large amount of data (the model data can be as big as 64 KB or 128 KB) to be transmitted from the first memory device to the machine learning processing device as fast as possible using all available microbumps.

However, in response to determining that the type of the requested data corresponds to the weight data, the processing device can determine that the number of microbumps to be used to transmit the data should correspond to a portion of microbumps in the first memory device. Because the size of the weight data can be relatively small when compared with the model data, the weight data may still be quickly transmitted using a smaller number of microbumps. In this way, the processing device can save processing resources in transmitting the data to the machine learning processing device.

On the other hand, in response to determining that the data is stored in the second memory device, the processing device may not determine a type of data. Because the input data is usually large in size (e.g., an image data can have pixel values of 1200 pixels by 1000 pixels, 1024 pixels by 768 pixels, etc.), the processing device can determine that the entire arrays of microbumps in the second memory device should be used to transmit the data.

At operation 840, the processing device transmits the data to the machine learning processing device using of the set of microbumps of the respective memory device. In one implementation, the processing device may not utilize all the microbumps in the respective device. In another implementation, the processing device can cause the respective memory device to transmit the data to the machine learning processing device using all microbumps in the respective memory device.

Figure 9:
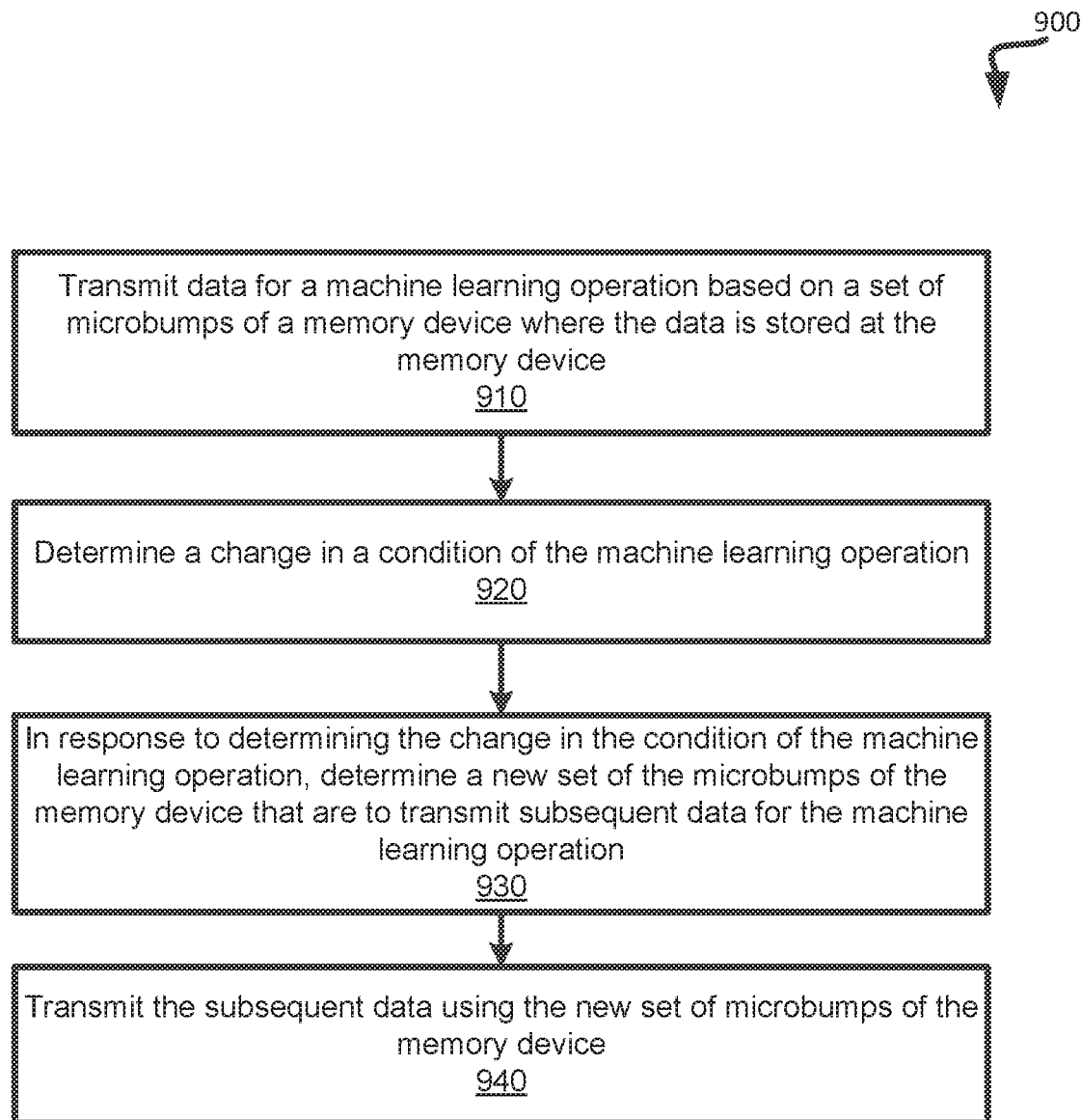
FIG. 9 is a flow diagram of an example method to transmit data using different sets of microbumps on a memory device in accordance with some embodiments of the present disclosure.

FIG. 9 is a flow diagram of an example method 900 to transmit data using different sets of microbumps on a memory device in accordance with some embodiments of the present disclosure. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the machine learning operation managing component 113 of FIG. 1. In some embodiments, the method 900 is performed by the local media controller 135 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 910, the processing device transmits data for a machine learning operation based on a set of microbumps of a memory device where the data is stored at the memory device. The processing device can transmit the data from the memory device to a machine learning processing device. In one implementation, the processing device can correspond to a machine learning operation managing component (e.g., the machine learning operation managing component 113 of FIG. 1). In such a case, the processing device can communicate with the memory device (or a local media controller (e.g., the local media controller 135 of FIG. 1)) to provide the data to the machine learning processing device. In another implementation, the processing device can correspond to the local media controller (e.g., the local media controller 135 of FIG. 1) of the memory device. In such a case, the processing device can retrieve the data from the respective memory device and transmit the data to the machine learning processing device. Moreover, in some implementations, the memory device can be a non-volatile memory device storing any data used in the machine learning operation, such as input data, model data, and output data. In some other implementations, the memory device can be a volatile memory device storing similar data for the machine learning operation.

The machine learning processing device can perform the machine learning operation in association with the memory device to classify or to support other inferences or decisions based on the processing of data, such as image data. The machine learning processing device can be a part of or separate from the host system. A machine learning operation can involve processing of input data (e.g., image data) in accordance with a machine learning model using a set of weight values for one or more levels of non-linear (or linear) operations. To perform such machine learning operations, the machine learning processing device can request data (e.g., the input data, data for the machine learning model, and data for the set of weight values) from the memory device. In response, the memory device can transmit the data for the machine learning operation to the machine learning processing device.

At operation 920, the processing device determines a change in a condition of the machine learning operation. Examples of the condition can include a status of a power supply associated with the memory device (e.g., a power supply to the memory sub-system, the memory device, or the host system), a temperature associated with the memory device (e.g., a temperature of the memory sub-system, the memory device or the host system), and a data size associated with the machine learning operation (i.e., a size of data used in the machine learning operation). As such, the condition of the machine learning operation can correspond to the condition of an operating environment to perform the machine learning operation for any of the memory device, the memory sub-system, or the host system.

In one implementation, the processing device can periodically receive information that indicates a current condition from the machine learning processing device or the host system. In another implementation, the processing device can periodically request the machine learning processing device or the host system for the current condition. As the condition information is received, the processing device can determine how much the condition has changed. For example, the processing device can first receive the condition information indicating that the power supply associated with the memory device is at a 100% capacity (or 10 mW). Then, the processing device can later receive the information indicating that the power supply is at an 80% capacity (or 8 mW). As long as the current condition is different from the previous condition, the processing device can determine that there has been a change to the condition of the machine learning operation. In another implementation, the processing device can determine the change in the condition when the difference in the two consecutive conditions exceed a threshold amount (e.g., 10% change). As another example of condition information, the processing device can periodically receive the condition information indicating that the machine learning operation requires a particular size of data (e.g., a size of the input data, model data, or weight data) for the current machine learning operation. Yet as another example, the processing device can receive temperature information such as changes from 50 F to 75 F. As such, a change in the condition can correspond to a change in the status of the power supply, a change in the operating temperature, and/or a change in the size of data that is to be used in the machine learning operation.

At operation 930, the processing device, in response to determining the change in the condition of the machine learning operation, the processing device determines a new set of the microbumps of the memory device. The new set of microbumps are to transmit subsequent data for the machine learning operation. The machine learning operation can involve processing a series of data. For example, the machine learning processing device can first request model data to configure itself to perform a machine learning operation according to a definition of a machine learning model included in the model data. Then, the machine learning processing device can request input data to start processing the input data in accordance with the model data. While processing the input data, the machine learning processing device can intermittently request corresponding weight data for each layer of the machine learning model. Accordingly, the data transmitted using the previous set of microbumps can be different from the subsequent data to be transmitted using the next set of microbumps as different data is requested by the machine learning processing device.

In another implementation, the data for the machine learning operation can be divided into portions of data. For example, the input data can be partitioned into multiple portions. Accordingly, a first portion of the input data can be transmitted using the previous set of microbumps, whereas a second portion of the input data can be transmitted using the next set of microbumps. The first and second portions of the input data can be at different sizes and different sets of microbumps can be used to transmit the different portions of the input data based on the different sizes.

In some implementations, before determining another set of microbumps for the subsequent data, the processing device can determine whether or not a threshold condition is satisfied. The threshold condition can be associated with a magnitude of the change in the condition. For example, the threshold condition can specify that the amount of change be at least 10%. Using the example above, when the power supply has dropped from 100% to 80%, the processing device can determine that a magnitude of the change in the power supply is 20%. The processing device can further determine that the threshold condition (e.g., 10%) has been satisfied. As another example, when the power supply is changed from 100% to 95%, the processing device can determine that the threshold condition (e.g., 10%) is not satisfied. In such a case, the processing device can withhold determining another set of microbumps and subsequently transmit data using the current set of microbumps (e.g., without updating the set of microbumps).

In determining the new set of microbumps, the processing device can consider a direction of the change. That is, the processing device can determine the number of microbumps to be included in the new set to be relatively more or less than the number of microbumps in the current set of microbumps, depending on a direction of the change. For example, if the power supply has decreased from the 100% to 80%, the processing device can determine that the number microbumps for the new set should be reduced. The processing device can select proportionally smaller number of microbumps for the new set. For example, the current set of microbumps can correspond to the entire set of the microbumps in the memory device. In response to determining that the power supply has dropped from the 100% to 80%, the processing device can identify or select 80% of the microbumps of the memory device or 20% less number of microbumps than the current set. Details about selecting which microbumps for transmitting the data will be described with respect to at least FIG. 11. However, if the direction of the change was an increase from 50% to 75% of the power supply, the processing device can determine that the number microbumps for the new set should be increased. Accordingly, the processing device can, for example, select 75% of the microbumps instead of 50% of microbumps or 25% more number of microbumps than the current set for transmitting the subsequent data.

At operation 940, the processing device transmits the subsequent data using the new set of microbumps of the memory device. In one implementation, the processing device can determine whether the new set of microbumps corresponds to all the microbumps (i.e., every microbump that can transfer data to the machine learning processing device) of the memory device. In response to determining that the new set of microbumps corresponds to all microbumps of the memory device, the processing device can transmit the subsequent data at once. That is, the processing device can transmit the subsequent data in one clock cycle via every microbump of the memory device. However, in response to determining that the new set of microbumps does not correspond to all the microbumps of the memory device, the processing device can divide or partition the subsequent data into multiple portions. The processing device can then transmit the portions of the subsequent data over a period of time. For example, the processing device can transmit each portion of the subsequent data in each clock cycle thereby transmitting the subsequent data over multiple clock cycles.

Figure 10A:
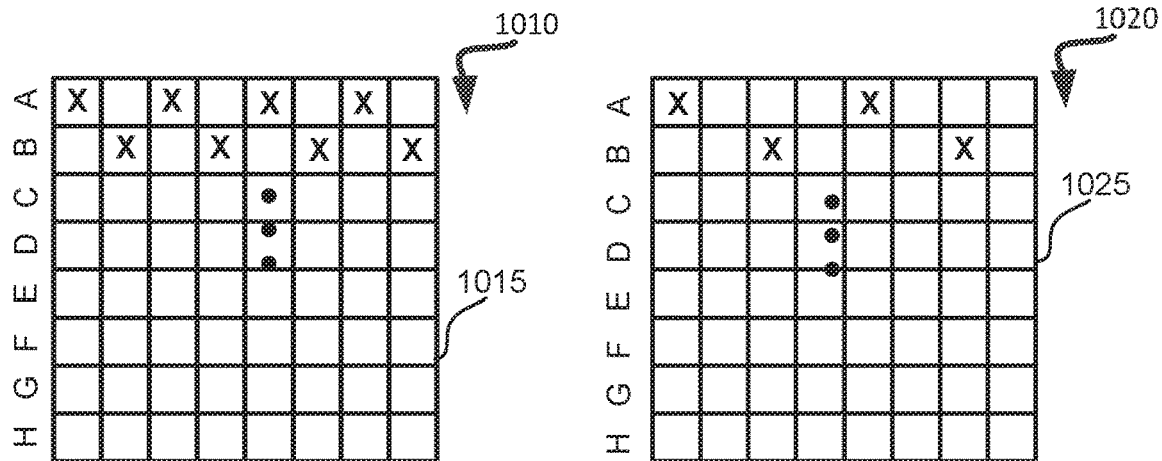
FIG. 10A illustrates examples of selecting microbumps in a memory device for transmitting data in accordance with some embodiments of the present disclosure.

FIG. 10A illustrates examples 1010 and 1020 of selecting microbumps in a memory device for transmitting data in accordance with some embodiments of the present disclosure. The examples 1010 and 1020 can be performed by a processing device such as the machine learning operation managing component 113 of FIG. 1. In some embodiments, the examples 1010 and 1020 are performed by another processing device such as the local media controller 135 of FIG. 1. The memory device can be a non-volatile or volatile memory device.

The example 1010 illustrates selected microbumps in a memory device 1015. It should be appreciated that the memory device 1015 is illustrated to have a relatively smaller number of microbumps for simplicity of illustration and that the memory device 1015 can have thousands of microbumps. Each square represents a microbump in the memory device 1015 and a square with a cross, "X," represents a selected microbump. Each alphabetical letter along a vertical side of the memory device 1015 indicates each group of microbumps. In this example 1010, each row represents a group of microbumps. However, it would be appreciated by the one skilled in the art that any other form of groups, such as columns of groups instead of rows, can be applicable to this example 1010.

The processing device can determine that a 50% of microbumps in the memory device 1015 should be selected for a new set of microbumps to transmit data for a machine learning operation. For each group (e.g., each one of groups A to H), the processing device can select 50% of the microbumps within the respective group. For example, the processing device can determine that there are eight microbumps in each group. Thus, the processing device can determine to select four microbumps from each group. In selecting the four microbumps, the processing device can select microbumps that are as far apart from each other (i.e., every other microbumps). As illustrated, for group A, the processing device can identify the first, third, fifth, and seventh microbumps to transmit the data. As for the next group (i.e., group B) in the sequence, the processing device can determine the four microbumps that are as far apart from each other and also, that are not adjacent to other selected microbumps, if possible. As such, the processing device can select the second, fourth, sixth, and eighth microbumps for the new set of microbumps as illustrated in the example 1010. In some embodiments, selecting microbumps that are farther apart from each other rather than closer to each other can improve the signal integrity of data that is being transmitted via the microbumps. For example, the effect of noise from one microbump will have a smaller impact on another microbump that is being used to transmit data.

The example 1020 illustrates selected microbumps in a memory device 1025. It should be appreciated that the memory device 1025 is illustrated to have a relatively smaller number of microbumps for simplicity of illustration and that the memory device 1025 can have thousands of microbumps. Similar to the example 1010, each square represents a microbump in the memory device 1025 and a square with a cross, "X," represents a selected microbump.

In the example 1020, the processing device can determine that a 25% of microbumps in the memory device 1025 should be selected for a new set of microbumps to transmit data for the machine learning operation. For each group (e.g., groups A to H), the processing device can select the 25% of microbumps within the respective group. For example, the processing device can determine that two microbumps from each group should be selected. In selecting the two microbumps, the processing device can select microbumps that have the same number of space (i.e., the same number of unselected microbumps) between each other. Accordingly, for group A, the processing device can identify the first and fifth microbumps to transmit the data as illustrated in the example 1020. As for the next group (i.e., group B) in the sequence, the processing device can determine the two microbumps that have the same spacing as the previous group and also, that are not adjacent to other selected microbumps, if possible. Thus, the processing device can select the third and seventh microbumps for the new set of microbumps as illustrated in the example 1020.

Figure 10B:
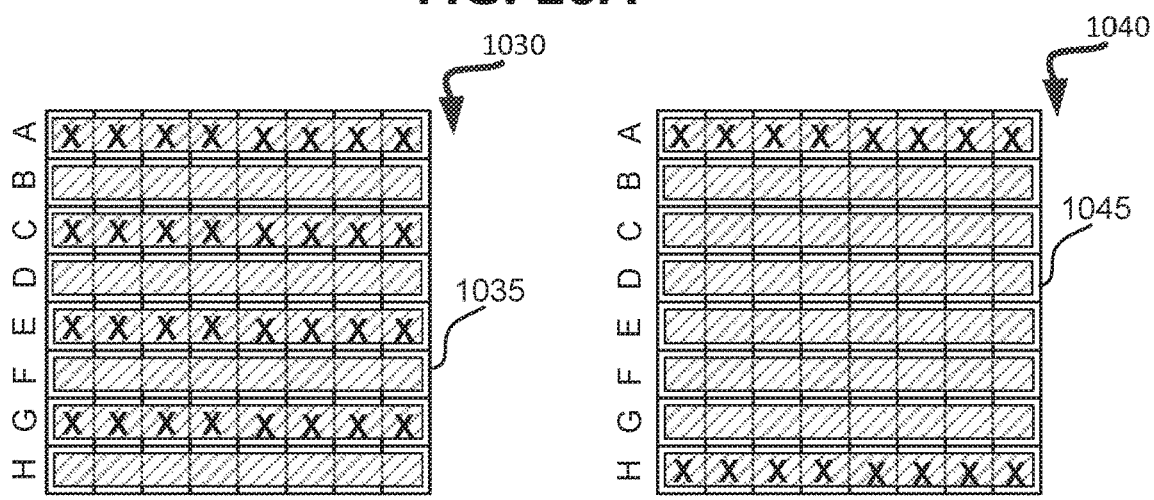
FIG. 10B illustrates other examples of selecting microbumps in a memory device for transmitting data in accordance with some embodiments of the present disclosure.

FIG. 10B illustrates other examples 1030 and 1040 of selecting microbumps in a memory device for transmitting data in accordance with some embodiments of the present disclosure. Similar to FIG. 10A, the examples 1030 and 1040 can be performed by a processing device such as the machine learning operation managing component 113 or the local media controller 135 of FIG. 1. The memory device can be a non-volatile or volatile memory device.

The example 1030 illustrates selected microbumps in a memory device 1035. It should be appreciated that the memory device 1035 is illustrated to have a relatively smaller number of microbumps for simplicity of illustration and that the memory device 1035 can have thousands or any other number of microbumps. As previously described, each square represents a microbump in the memory device 1035 and a square with a cross, "X," represents a selected microbump.

The processing device can determine that a 50% of microbumps in the memory device 1035 should be selected for a new set of microbumps to transmit data for a machine learning operation. The processing device can determine the number of groups included in the memory device 1035. As illustrated, there are eight groups—groups A to H. Then, the processing device can determine that four of the eight groups (i.e., 50% of the groups) should be selected. In selecting the four groups, the processing device can select groups that are equally apart from each other (i.e., every other groups). As illustrated, the processing device can select the groups A, C, E, and H. Then, the processing device can identify all microbumps in each selected group to be included in the new set of microbumps as marked by Xs in the example 1030.

The example 1040 illustrates selected microbumps in a memory device 1045. It should be appreciated that the memory device 1045 is illustrated to have a relatively smaller number of microbumps for simplicity of illustration and that the memory device 1045 can have any number of microbumps. Similar to the example 1030, each square represents a microbump in the memory device 1045 and a square with a cross, "X," represents a selected microbump.

In the example 1040, the processing device can determine that a 25% of microbumps in the memory device 1045 should be selected for a new set of microbumps to transmit data for the machine learning operation. As illustrated, the processing device can determine that there are eight groups (groups A to H) in the memory device 1045. Then, the processing device can determine that two of the eight groups (i.e., 25% of the groups) should be selected. In selecting the two groups, the processing device can select groups that are as far apart from each other. As illustrated, the processing device can select the groups A and H. Then, the processing device can identify all of the microbumps in each selected group to be included in the new set of microbumps as marked by Xs in the example 1040.

Figure 10C:
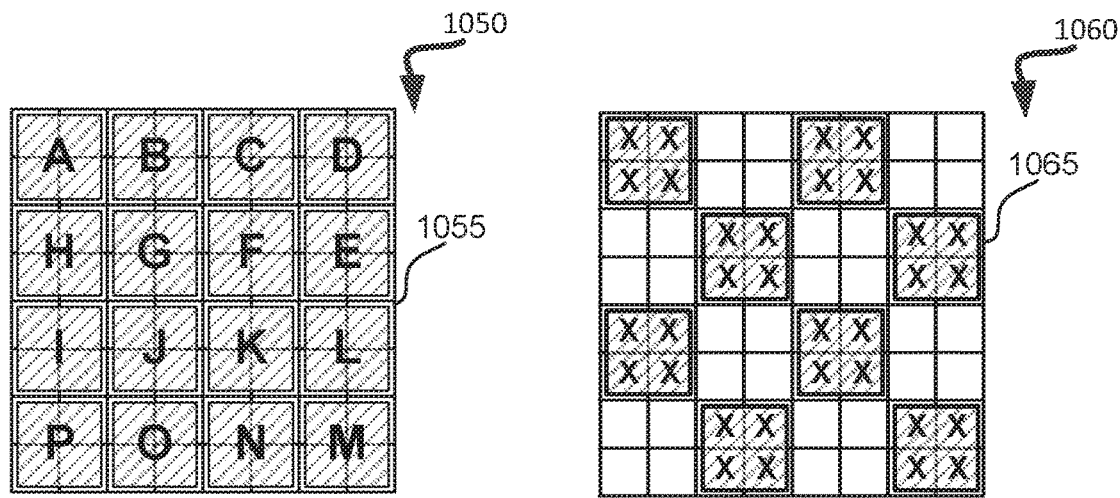
FIG. 10C illustrates other examples of selecting microbumps in a memory device for transmitting data in accordance with some embodiments of the present disclosure.

FIG. 10C illustrates other examples 1050 and 1060 of selecting microbumps in a memory device for transmitting data in accordance with some embodiments of the present disclosure. Similar to FIG. 10A, the examples 1050 and 1060 can be performed by a processing device such as the machine learning operation managing component 113 or the local media controller 135 of FIG. 1. The memory device can be a non-volatile or volatile memory device.

The example 1050 illustrates a different form of groups in a memory device 1055. It should be appreciated that the memory device 1055 is illustrated to have a relatively smaller number of microbumps for simplicity of illustration and that the memory device 1055 can have any number of microbumps. Each alphabetical letter inside a square represents a group of four microbumps. In the example 1050, there are a series of sixteen groups (e.g., groups A to M) arranged adjacent to each other. For example, group E is located below group D so that groups E and D are adjacent to each other. However, it would be appreciated by the one skilled in the art that any other form of groups, such as a square or a rectangle having a different number of microbumps can be possible.

The example 1060 illustrates selected microbumps in a memory device 1065. As previously described, the memory device 1065 is illustrated to have a relatively smaller number of microbumps for simplicity of illustration and that the memory device 1065 can have any number of microbumps.

In the example 1060, the processing device can determine that a 50% of microbumps in the memory device 1065 should be selected for a new set of microbumps to transmit data for the machine learning operation. The processing device can determine that there are sixteen groups (e.g., corresponding to groups A to M in the example 1050) in the memory device 1065. Then, the processing device can determine that eight of the sixteen groups (i.e., 50% of the groups) should be selected. In selecting the eight groups, the processing device can select groups that are equally or as far apart from each other. As illustrated, the processing device can select every other group in the series (e.g., groups A, C, E, G, I, K, M, and O). Then, the processing device can identify all microbumps in each selected group to be included in the new set of microbumps as marked by Xs in the example 1060.

Figure 11:
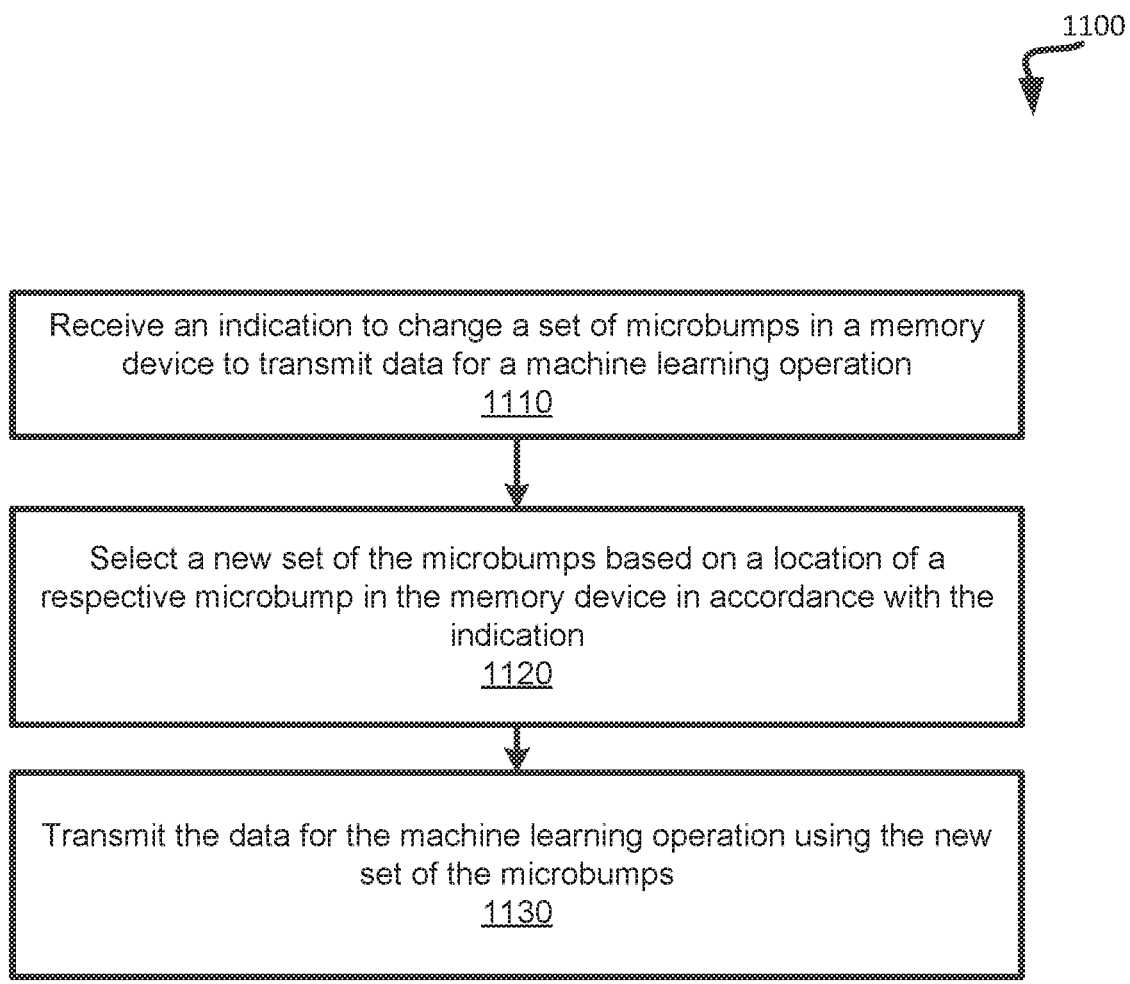
FIG. 11 is a flow diagram of another example method to transmit data using different sets of microbumps on a memory device in accordance with some embodiments of the present disclosure.

FIG. 11 is a flow diagram of another example method 1100 to transmit data using different sets of microbumps on a memory device in accordance with some embodiments of the present disclosure. The method 1100 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1100 is performed by the machine learning operation managing component 113 of FIG. 1. In some other embodiments, the method 1100 is performed by the local media controller 135 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1110, the processing device receives an indication to change a set of microbumps in a memory device to transmit data for a machine learning operation. Microbumps in the memory device are used to transmit data such as input data, model data, and weight data used in a machine learning operation between the memory device and a machine learning processing device. The input data can correspond to data (e.g., image data) to be processed by the machine learning operation. The model data can define the machine learning operation and the weight data representing one or more numerical values used in the machine learning operation. While transmitting data for the machine learning operation using a set of microbumps, the processing device can receive an indication from a host system or a memory sub-system to change the set of microbumps (i.e., a number of microbumps) being used to transmit the data.

Such an indication can include information about a change to a condition (e.g., an operation condition for performing the machine learning operation). For example, the indication can describe that there has been a change in a level of a power supply (to a respective memory device, memory sub-system, or host system) from 100% to 90%. As another example, the indication can specify that a temperature of the operation condition has changed from 50 F to 65 F. In another implementation, the indication can specify that a number microbumps transmitting the data for the machine learning operation to be changed to a particular number of microbumps (e.g., the indication requesting the processing device to change the number of microbumps from 100% to 70%).

At operation 1120, the processing device selects a new set of the microbumps based on a location of a respective microbump in the memory device in accordance with the indication. In one implementation, the processing device can determine groups of microbumps in the memory device. For example, the microbumps can be divided into multiple groups based on a respective location in the memory device. For example, the microbumps can be grouped by each row or column or in any other forms. Each group can include the same number of microbumps. Moreover, each group can be adjacent to each other (i.e., arranged in a sequence) in the memory device.

In further implementation, at operation 1120, the processing device can determine a total number of microbumps to be selected for a new set based on the indication. In one implementation, the indication can specify the change in the operation condition of the machine learning operation from 100% of power supply to 65%. Based on the indication, the processing device can determine that the total number of microbumps for the new set to be in proportion to the change in the condition. For example, the processing device can determine the total number of microbumps for the new set should correspond to 65% of microbumps in the memory device because the power supply level has been decreased to 65%. As another example, in case the indication describes that the temperature has changed from 50 F to 65 F (which corresponds to a 30% increase), the processing device can determine that the total number of microbumps for the new set should be increased by 30% when compared to the number of microbumps in the current set. In another implementation, the indication can specify a particular number of the microbumps. In such a case, the processing device can determine the total number of microbumps to correspond to the specified number included the indication.

After determining the groups of microbumps and the number of microbumps to be selected for the new set, the processing device can identify the new set of microbumps corresponding to the total number of microbumps from the groups. In one implementation, the processing device can determine a number of microbumps to be selected from each group. For example, the processing device can compute the number of microbumps for each group based on the total number of microbumps for the new set and a total number of groups in the memory device (i.e., the processing device can divide the total number of microbumps for the new set by the total number of groups in the memory device). The processing device can select microbumps from each group that correspond to the computed number of microbumps. In this way, the processing device can select the same number of microbumps from each group. When selecting microbumps from each group, the processing device can microbumps that are evenly distributed throughout the respective group. For example, the processing device can select microbumps having the same number of microbumps (i.e., unselected microbumps) between each other. In case the processing device is selecting 50% of microbumps in each group, the processing device can select every other microbumps. When selecting 25% of microbumps, the processing device can select every fourth microbumps in each group.

In another implementation, the processing device can identify the new set of microbumps based on selected groups. For example, the processing device can determine a number of groups for selection based on the total number of microbumps to be selected and a number of microbumps in each group. In case there are a thousand microbumps to be selected and there are a hundred microbumps in each group, the processing device can determine that ten groups are to be selected. Accordingly, the processing device can select the determined number of groups. Then, the processing device can identify all microbumps in the selected groups for the new set of microbumps. When selecting the determined number of groups, the processing device can select groups that are as far apart from each other. For example, if the processing device were to select ten groups out of twenty groups in total, the processing device can select every other groups and consequently each microbump in the every other groups.

At operation 1130, the processing device transmits the data for the machine learning operation using the new set of the microbumps. For example, the processing device can retrieve the data from a corresponding memory device and determine the new set of the microbumps to transmit the data. Then, the processing device can cause the data to be transmitted to the machine learning processing device or the host system through the new set of microbumps.

Figure 12:
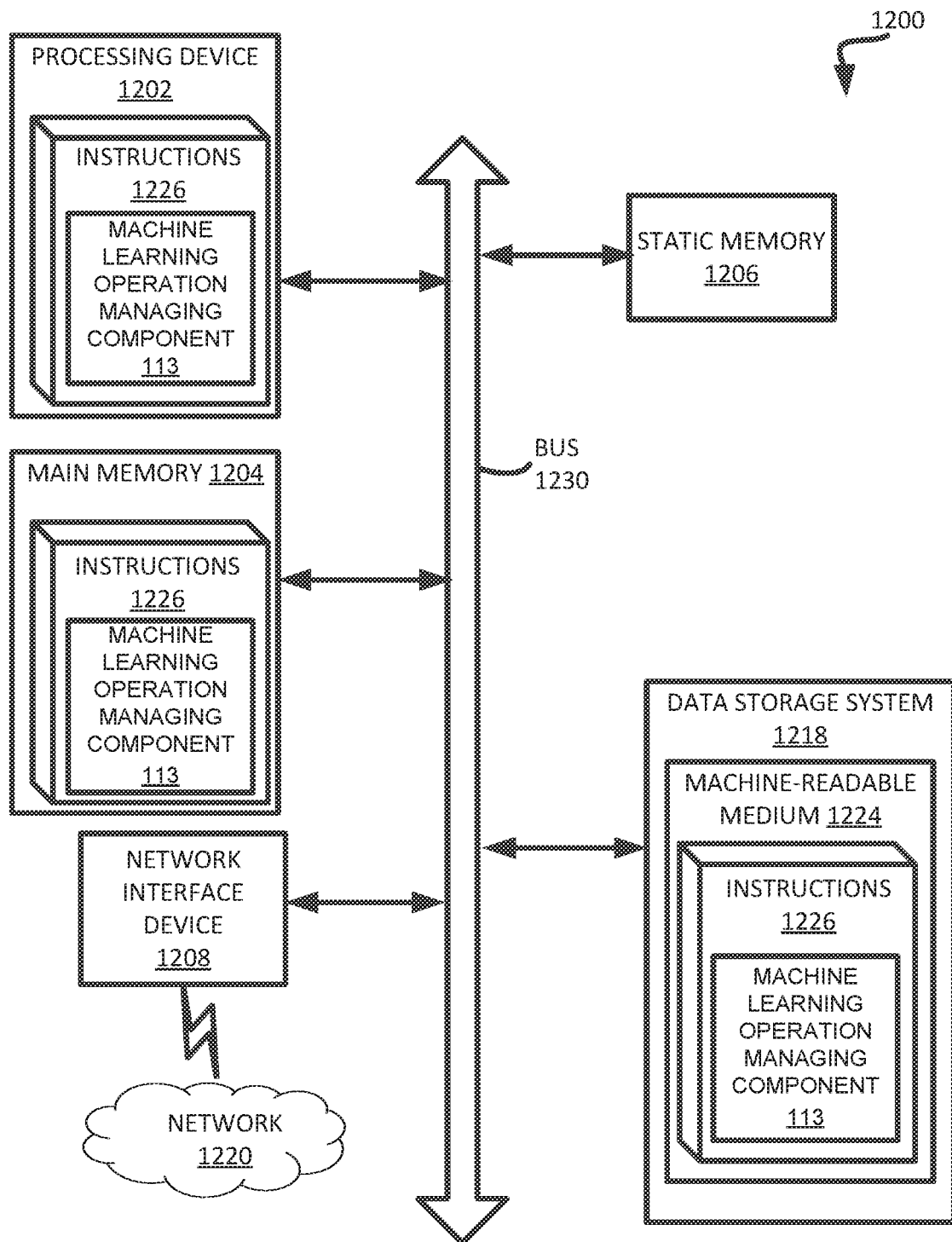
FIG. 12 is a block diagram of an example computer system in which embodiments of the present disclosure may operate.

FIG. 12 illustrates an example machine of a computer system 1200 within which a set of instructions, for causing the machine to perform any one or more of the methodologies discussed herein, can be executed. In some embodiments, the computer system 1200 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the machine learning operation managing component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM) or RDRAM, etc.), a static memory 1206 (e.g., flash memory, static random access memory (SRAM), etc.), and a data storage system 1218, which communicate with each other via a bus 1230.

Processing device 1202 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 can also be one or more special-purpose processing devices such as an application specific integrated circuit (ASIC), a field programmable gate array (FPGA), a digital signal processor (DSP), network processor, or the like. The processing device 1202 is configured to execute instructions 1226 for performing the operations and steps discussed herein. The computer system 1200 can further include a network interface device 1208 to communicate over the network 1220.

The data storage system 1218 can include a machine-readable storage medium 1224 (also known as a computer-readable medium) on which is stored one or more sets of instructions 1226 or software embodying any one or more of the methodologies or functions described herein. The instructions 1226 can also reside, completely or at least partially, within the main memory 1204 and/or within the processing device 1202 during execution thereof by the computer system 1200, the main memory 1204 and the processing device 1202 also constituting machine-readable storage media. The machine-readable storage medium 1224, data storage system 1218, and/or main memory 1204 can correspond to the memory sub-system 110 of FIG. 1.

In one embodiment, the instructions 1226 include instructions to implement functionality corresponding to a machine learning operation managing component (e.g., the machine learning operation managing component 113 of FIG. 1). While the machine-readable storage medium 1224 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory device comprising a plurality of microbumps; and
   a processing device, operatively coupled with the memory device, to perform operations comprising:
      transmitting data for a machine learning operation using a first set of microbumps of the plurality of microbumps of the memory device, the data being stored at the memory device;
      receiving information indicating a current condition of the machine learning operation;
      determining a change in a condition of the machine learning operation based on the received information;
      in response to determining the change in the condition of the machine learning operation, determining, based on the received information, a total number of microbumps and identifying a second set of microbumps of the memory device to transmit subsequent data for the machine learning operation; and
      transmitting the subsequent data using the second set of microbumps of the memory device.

2. The system of claim 1, wherein the condition includes at least one of a power supply associated with the memory device, a temperature associated with the memory device, or a data size associated with the machine learning operation.

3. The system of claim 1, wherein the determining of the second set of microbumps comprises:
   determining that the change in the condition of the machine learning operation satisfies a threshold condition, the threshold condition being associated with a magnitude of the change in the condition, and wherein the determining of the second set of microbumps is further in response to determining that the change in the condition of the machine learning operation satisfies a threshold condition.

4. The system of claim 1, wherein a number of microbumps included in the second set of microbumps is based on a direction of the change in the condition of the machine learning operation.

5. The system of claim 1, wherein a number of microbumps included in the second set of microbumps is based on a magnitude of the change in the condition of the machine learning operation.

6. The system of claim 1, wherein the determining of the second set of microbumps is based on locations of respective microbumps in the memory device.

7. The system of claim 1, wherein the memory device corresponds to a non-volatile memory device.

8. The system of claim 1, wherein the memory device corresponds to a volatile memory device.

9. A method comprising:
   transmitting data for a machine learning operation using a first set of microbumps of a plurality of microbumps of a memory device, the data being stored at the memory device;
   receiving information indicating a current condition of the machine learning operation;
   determining a change in a condition of the machine learning operation based on the received information;
   in response to determining the change in the condition of the machine learning operation, determining, by a processing device based on the received information, a total number of microbumps and identifying a second set of microbumps of the memory device to transmit subsequent data for the machine learning operation; and
   transmitting the subsequent data using the second set of microbumps of the memory device.

10. The method of claim 9, wherein the condition includes at least one of a power supply associated with the memory device, a temperature associated with the memory device, or a data size associated with the machine learning operation.

11. The method of claim 9, wherein the determining of the second set of microbumps comprises:
   determining that the change in the condition of the machine learning operation satisfies a threshold condition, the threshold condition being associated with a magnitude of the change in the condition, and wherein the determining of the second set of microbumps is further in response to determining that the change in the condition of the machine learning operation satisfies a threshold condition.

12. The method of claim 9, wherein a number of microbumps included in the second set of microbumps is based on a direction of the change in the condition of the machine learning operation.

13. The method of claim 9, wherein a number of microbumps included in the second set of microbumps is based on a magnitude of the change in the condition of the machine learning operation.

14. The method of claim 9, wherein the determining of the second set of microbumps is based on locations of respective microbumps in the memory device.

15. The method of claim 9, wherein the memory device corresponds to a non-volatile memory device.

16. The method of claim 9, wherein the memory device corresponds to a volatile memory device.

17. A method comprising:
- receiving an indication to change a first set of microbumps in a memory device to transmit data for a machine learning operation, the indication comprising information about a condition of a machine learning operation;
- determining a total number of microbumps to be selected based on the indication;
- selecting, by a processing device, a second set of microbumps based on locations of respective microbumps in the memory device in accordance with the indication; and
- transmitting the data for the machine learning operation using the second set of microbumps.

18. The method of claim 17, wherein the selecting of the second set of the microbumps comprises:
- determining a plurality of groups of microbumps, each group comprising a defined number of microbumps and each group being adjacent to another group of the plurality of groups of microbumps in the memory device; and
- identifying the second set of microbumps corresponding to the total number of microbumps from the plurality of groups of microbumps in the memory device.

19. The method of claim 18, wherein the identifying of the second set of the microbumps comprises:
- determining a second number of microbumps for each group based on the total number of microbumps and a total number of groups in the plurality of groups of microbumps; and
- for each group in the plurality of groups of microbumps, selecting a subset of microbumps comprising the second number of microbumps.

20. The method of claim 18, wherein the identifying of the second set of the microbumps comprises:
- determining a second number of groups for selection based on the total number of microbumps to be selected and a number of microbumps in each group;
- selecting a subset of groups corresponding to the second number of groups; and
- determining the second set of microbumps including each microbump in the subset of groups.

* * * * *